United States Patent
Guo et al.

(10) Patent No.: US 12,389,560 B2
(45) Date of Patent: Aug. 12, 2025

(54) SPLICING DISPLAY DEVICE

(71) Applicants: BOE MLED Technology Co., Ltd., Beijing (CN); BOE TECHNOLOGY GROUP CO., LTD., Beijing (CN)

(72) Inventors: Shaofei Guo, Beijing (CN); Shipeng Wang, Beijing (CN); Chao Tian, Beijing (CN); Yiping Ruan, Beijing (CN); Zhonghua Li, Beijing (CN); Jiayi Li, Beijing (CN)

(73) Assignees: BOE MLED Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/027,905

(22) PCT Filed: Mar. 29, 2022

(86) PCT No.: PCT/CN2022/083588
§ 371 (c)(1),
(2) Date: Mar. 22, 2023

(87) PCT Pub. No.: WO2023/184134
PCT Pub. Date: Oct. 5, 2023

(65) Prior Publication Data
US 2024/0314944 A1    Sep. 19, 2024

(51) Int. Cl.
*H05K 5/02*    (2006.01)
*H05K 5/30*    (2025.01)

(52) U.S. Cl.
CPC ............ *H05K 5/30* (2025.01); *H05K 5/0217* (2013.01)

(58) Field of Classification Search
CPC ........................... H05K 5/0017; H05K 5/0217

USPC .......................................... 361/807, 809, 810
See application file for complete search history.

(56) References Cited

U.S. PATENT DOCUMENTS

| 5,369,281 A | 11/1994 | Spinnler et al. |
| 5,533,237 A * | 7/1996 | Higgins ................ F16B 21/075 24/297 |

FOREIGN PATENT DOCUMENTS

| CN | 204560074 U | 8/2015 |
| CN | 205722646 U | 11/2016 |
| CN | 107116500 A | 9/2017 |
| CN | 207182829 U | 4/2018 |
| CN | 207975393 U | 10/2018 |
| CN | 108898969 A | 11/2018 |

(Continued)

*Primary Examiner* — Hung S. Bui
(74) *Attorney, Agent, or Firm* — HOUTTEMAN LAW LLC

(57) ABSTRACT

A splicing display device includes: a case; display modules on the case; and a mounting structure, including a first positioning assembly on a side of the case facing the display module, and a second positioning assembly on a side of the display module facing the case, where positions of the first positioning assembly and the second positioning assembly correspond to each other in a thickness direction of the display module, and the first and second positioning assemblies contact and fit in a direction parallel to a plane in which the display module is located, so as to cause the display module to approach at least one display module adjacent thereto. The contact and fit between the first and second positioning assemblies exerts a first pressing force on the whole display module to push the display module to closely approach at least one adjacent display module thereof.

18 Claims, 20 Drawing Sheets

(56) References Cited

FOREIGN PATENT DOCUMENTS

| CN | 108986679 | A | 12/2018 |
| CN | 109854585 | A | 6/2019 |
| CN | 110504558 | A | 11/2019 |
| CN | 111306149 | A | 6/2020 |
| CN | 112211882 | A | 1/2021 |
| CN | 215814923 | U | 2/2022 |

* cited by examiner

SPLICING DISPLAY DEVICE

TECHNICAL FIELD

The present disclosure belongs to the field of display technology, and particularly relates to a splicing display device.

BACKGROUND

Micro inorganic light emitting diodes include mini light emitting diodes (Mini LED for short) and micro light emitting diodes (Micro LED for short). A Mini LED has a size of about 100 μm to 300 μm, and a Micro LED has a size less than 100 μm. Display devices adopting Mini LED/Micro LED technology have advantages of high brightness, high resolution, high color saturation, fast photoelectric response, long service life, capability of transparent flexible display and the like. In addition, by seamlessly splicing a plurality of Mini LED/Micro LED-based display modules, super-large-size display products can be realized, which have broad application prospects in the fields of monitoring and commanding, high-definition broadcast performance, high-end cinema, medical detection, outdoor advertising, conference and exhibition and other fields requiring large-size display.

However, in the related art, when splicing a plurality of display modules, it is difficult to make adjacent display modules adjoin closely, and the problem of a too large splicing seam is likely to occur, which is not conducive to controlling a spacing between LEDs from adjacent display modules after the splicing. If the spacing between the LEDs is too large, a display dark seam easily occurs, which in turn affects yield of splicing and assembling and display effect.

SUMMARY

The present disclosure aims to solve at least one of the technical problems existing in the related art, and provides a splicing display device, in which a first pressing force is applied to a whole display module through contact fit between a first positioning assembly and a second positioning assembly in a direction parallel to a plane in which the display module is located, and the display module is pushed to automatically approach closely at least one adjacent display module thereof by the first pressing force, so as to reduce a splicing seam between the display module and the adjacent display module, thereby solving the problem that a display dark seam easily occurs and yield of splicing and assembling and display effect are affected due to a too large splicing seam.

Embodiments of the present disclosure provides a splicing display device, including a case, a plurality of display modules on the case, and a mounting structure between the case and at least one display module, the mounting structure includes:
- a first positioning assembly on a side of the case facing the display module; and
- a second positioning assembly on a side of the display module facing the case,
- wherein positions of the first positioning assembly and the second positioning assembly correspond to each other in a thickness direction of the display module, and the first positioning assembly and the second positioning assembly contact and fit in a direction parallel to a plane in which the display module is located, so as to cause the display module to fit with and be in contact with at least one display module adjacent thereto.

According to the splicing display device provided by the embodiments of the present disclosure, the first positioning assembly and the second positioning assembly contacts and fits with each other in the direction parallel to the plane in which the display module is located, the first pressing force can be applied to the whole corresponding display module through the contact and fit between the first positioning assembly and the second positioning assembly, the first pressing force is parallel to the plane in which the display module is located, and the display module can be pushed by the first pressing force to automatically approach closely with at least one adjacent display module thereof in the direction of the first pressing force, so as to reduce the splicing seam between the display module and the adjacent display module, facilitate control of a spacing between LEDs from adjacent display modules after the splicing, thereby avoiding occurrence of the display dark seam and improving the yield of splicing and assembling and display effect.

In some exemplary embodiments, the first positioning assembly includes a positioning pillar, the positioning pillar includes a first sidewall and a second sidewall opposite to each other:
- the second positioning assembly includes a positioning fitting member and a pressing member, the positioning fitting member has a positioning hole along the thickness direction of the display module, the pressing member is on the positioning fitting member and at least partially in the positioning hole, and
- a part of the pressing member in the positioning hole contacts and fits with the first sidewall after the positioning pillar is inserted into the positioning hole, so as to make the second sidewall fit with and be in contact with a hole wall of the positioning hole.

In some exemplary embodiments, the pressing member is a compression spring, the compression spring includes a pressing section, the positioning hole includes a first hole wall and a second hole wall opposite to each other, the pressing section is between the first hole wall and the second hole wall, and the pressing section is gradually switched from an initial state to a first pressing state by the contact and fit between the positioning pillar and the pressing section during a process of inserting the positioning pillar into the positioning hole, wherein
- when the pressing section is in the first pressing state, the pressing section contacts and fits with the first sidewall, and the second sidewall fits with and is in contact with the second hole wall; and a maximum distance between the pressing section and the first hole wall when the pressing section is in the first pressing state is less than a maximum distance between the pressing section and the first hole wall when the pressing section is in the initial state.

In some exemplary embodiments, the mounting structure further includes:
- a first limiter on a side of the pressing section facing the second hole wall; and
- a second limiter on the first sidewall of the positioning pillar,
- wherein when the pressing section is in the first pressing state, positions of the first limiter and the second limiter correspond to each other in the direction parallel to the plane in which the display module is located, and the first limiter and the second limiter fit with each other, so as to limit positions of the pressing section and the positioning pillar in the thickness direction of the display module.

In some exemplary embodiments, the first limiter includes a limit protrusion, and the second limiter includes a limit recess, and when the pressing section is in the first pressing state, the limit protrusion is clamped into the limit recess to connect the pressing section and the positioning pillar by clamping.

In some exemplary embodiments, sizes and shapes of the limit protrusion and the limit recess match with each other, and a surface of the limit protrusion is arcuate at least in a movement direction in which the positioning pillar is inserted into the positioning hole.

In some exemplary embodiments, when the pressing section is in the first pressing state, there is a movable distance between the pressing section and the first hole wall, the positioning pillar is able to be driven to move in a direction close to the first hole wall by controlling a corresponding display module to move laterally in a direction facing away from the at least one display module adjacent thereto, and the pressing section is switched from the first pressing state to a second pressing state through the contact and fit between the positioning pillar and the pressing section, wherein a maximum distance between the pressing section and the first hole wall when the pressing section is in the second pressing state is less than the maximum distance between the pressing section and the first hole wall when the pressing section is in the first pressing state.

In some exemplary embodiments, cross sections of the second sidewall and the second hole wall match with each other in shape and size.

In some exemplary embodiments, a first end of the pressing section is at an entry of the positioning hole, a second end of the pressing section extends in a direction away from the entry and is a free end, and when the pressing section is in the initial state, a distance of the pressing section from the first hole wall gradually increases along a direction from the first end to the second end thereof.

In some exemplary embodiments, the positioning fitting member further has a fixing recess spaced apart from the positioning hole, the compression spring further includes a fixing section and an intermediate section, the intermediate section is connected between the fixing section and the pressing section, the fixing section is inserted into and connected to the fixing recess, and the intermediate section is on a side of the positioning fitting member facing the positioning pillar.

In some exemplary embodiments, an end of the fixing section away from the intermediate section is provided with a hook, and the hook is embedded in a recess wall of the fixing recess.

In some exemplary embodiments, the positioning pillar includes a main body and a guide end, the guide end is on a side of the main body facing the positioning fitting member, and a cross-sectional area of the guide end gradually decreases along the movement direction in which the positioning pillar is inserted into the positioning hole.

In some exemplary embodiments, for the at least one display module, a plurality of mounting structures are arranged between each display module and the case, the plurality of mounting structures are arranged along a circumferential direction of the display module, and each mounting structure is arranged close to an edge of the display module.

In some exemplary embodiments, a first connector is provided on the display module, a second connector is provided on the case, positions of the first connector and the second connector correspond to each other in the thickness direction of the display module, and the first connector and the second connector are connected by magnetic adsorption.

In some exemplary embodiments, in two adjacent display modules, a third connector and a fourth connector are respectively arranged on opposite sides of the two display modules, positions of the third connector and the fourth connector correspond to each other in a splicing direction in which the two display modules are spliced, and the third connector and the fourth connector are connected by magnetic adsorption.

In some exemplary embodiments, each display module includes a first side, a second side, a third side and a fourth side which are sequentially connected, each of the first side and the second side is provided with at least one third connector, each of the third side and the fourth side is provided with at least one fourth connector, a number of the at least one third connector on the first side and a number of the at least one fourth connector on the third side are the same, a positon of the at least one third connector on the first side and a position of the at least one fourth connector on the third side are in one-to-one correspondence, a number of the at least one third connector on the second side and a number of the at least one fourth connector on the fourth side are the same and a positon of the at least one third connector on the second side and a position of the at least one fourth connector on the fourth side are in one-to-one correspondence.

In some exemplary embodiments, the splicing display device further includes leveling structures, wherein each display module is provided with corresponding ones of the leveling structures arranged between the display module and the case, and the ones of leveling structures are arranged along a circumferential direction of the display module, each leveling structure includes:
  a first leveling assembly fitting with a side of the case facing the display module; and
  a second leveling assembly fitting with a side of the display module facing the case, wherein
  positions of the first leveling assembly and the second leveling assembly correspond to each other in the thickness direction of the display module, the first leveling assembly and the second leveling fit by driving, and by operating the leveling structure from a side of the splicing display device, a distance between a part of the display module corresponding to the leveling structure and the case is able to be changed.

In some exemplary embodiments, the first leveling assembly includes a mounting seat and an adjusting member, the mounting seat is on a side of the case facing the display module, the mounting seat has a limit hole along the thickness direction of the display module, a first end of the adjusting member is inserted into the limit hole from a side of the mounting seat, and a second end of the adjusting member is outside the mounting seat:
  the second leveling assembly includes a supporting member in the limit hole and capable of moving up and down along the limit hole, a first end of the supporting member is configured to fit with a side of the display module facing the case, and a first end of the adjusting member is configured to fit with a second end of the supporting member, and
  when the second end of the adjusting member is operated from a side of the splicing display device, the adjusting member is able to be driven to move in an extending direction thereof, and the supporting member is driven to move up and down through the fit between the first end of the adjusting member and the second end of the supporting member.

In some exemplary embodiments, the second end of the supporting member is provided with a first inclined portion, the first end of the adjusting member is provided with a second inclined portion, the first inclined portion contacts and fits with the second inclined portion, and a slope of the first inclined portion is the same as a slope of the second inclined portion; or the second end of the supporting member is provided with a third inclined portion, and the first end of the adjusting member contacts and fits with the third inclined portion; or, the first end of the adjusting member is provided with a fourth inclined portion, and the second end of the supporting member contacts and fits with the fourth inclined portion.

In some exemplary embodiments, the first leveling assembly further includes an anti-release member, the anti-release member is on the mounting seat and fits with the supporting member to prevent the supporting member from being released from the limit hole in a direction away from the adjusting member.

In some exemplary embodiments, in each leveling structure, there are a plurality of adjusting members, the plurality of adjusting members are arranged along a circumferential direction of the supporting member, and distances of the plurality of adjusting members from the display module are different to each other.

BRIEF DESCRIPTION OF DRAWINGS

FIGS. 4a to 4c show three different force states of the display module, respectively:

FIGS. 5a and 5b show two different force states of adjacent display modules, respectively:

FIGS. 6a to 6c show three different distributions and force applications of the plurality of mounting structures on the single display module, respectively:

DETAIL DESCRIPTION OF EMBODIMENTS

Figure 1:
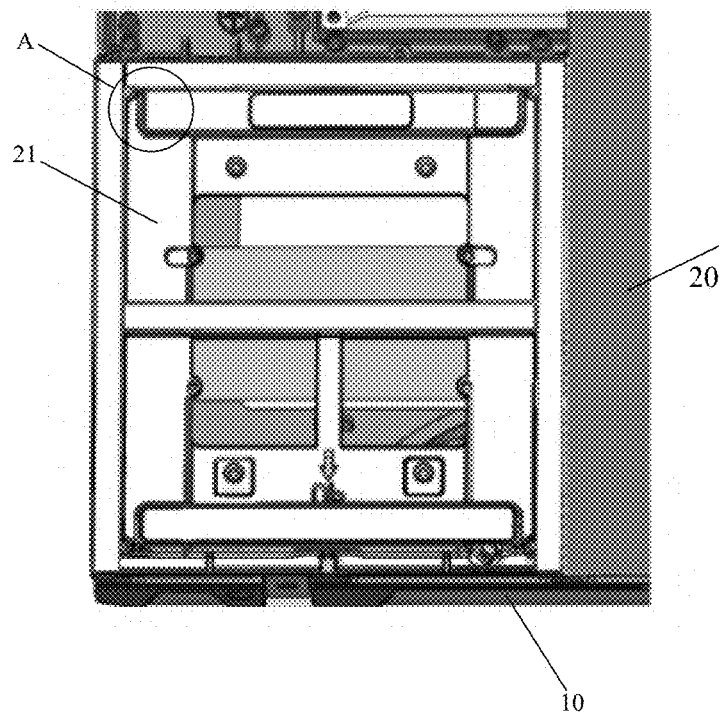
FIG. 1 is a schematic partial structural diagram of a splicing display device according to some embodiments of the present disclosure.
Figure 2:
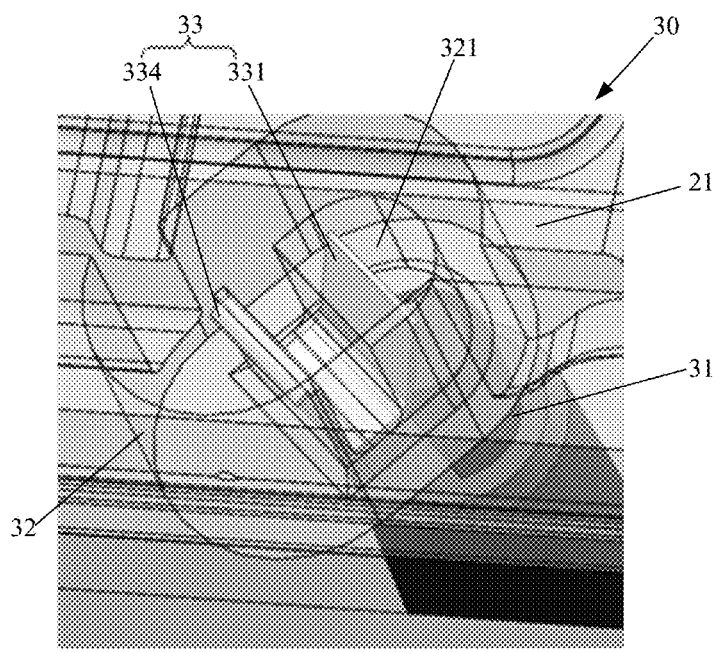
FIG. 2 is a schematic enlarged perspective view of a part A of the splicing display device of FIG. 1.

In order to make objects, technical solutions and advantages of the present disclosure more clear, the present disclosure will be further described in detail with reference to the accompanying drawings. Obviously, embodiments described herein are only some, but not all, of embodiments of the present disclosure. Based on the embodiments of the present disclosure, all other embodiments obtained by a person of ordinary skill in the art without creative efforts shall fall within the protection scope of the present disclosure.

Shapes and sizes of various components in the drawings are not true to scale, but for the purpose of facilitate understanding of the contents of the embodiments of the present disclosure.

Unless defined otherwise, technical or scientific terms used herein should have the same meaning as commonly understood by one of ordinary skill in the art to which the present disclosure belongs. The terms "first", "second", and the like used herein are not intended to indicate any order, quantity, or importance, but rather are used for distinguishing one element from another. Similarly, the terms "a", "an", "the", and the like used herein do not denote a limitation of quantity, but rather denote the presence of at least one. The term "including", "including", or the like, means that the element or item preceding the term contains the element or item listed after the term and its equivalent, but does not exclude the presence of other elements or items. The term "connecting" or "coupling" is not limited to physical or mechanical connection, but may include electrical connection, whether direct or indirect. The terms "upper", "lower", "left", "right", and the like are used only to indicate relative positional relationships, and when the absolute position of an object being described is changed, the relative positional relationships may also be changed accordingly.

Embodiments of the present disclosure are not limited to the embodiments shown in the accompanying drawings, but include modifications to configurations formed based on a manufacturing process. Therefore, regions illustrated in the drawings are only for illustration, and shapes of the regions illustrated in the drawings illustrate exemplary shapes of the regions of elements, but are not intended to be limiting.

Figure 19:
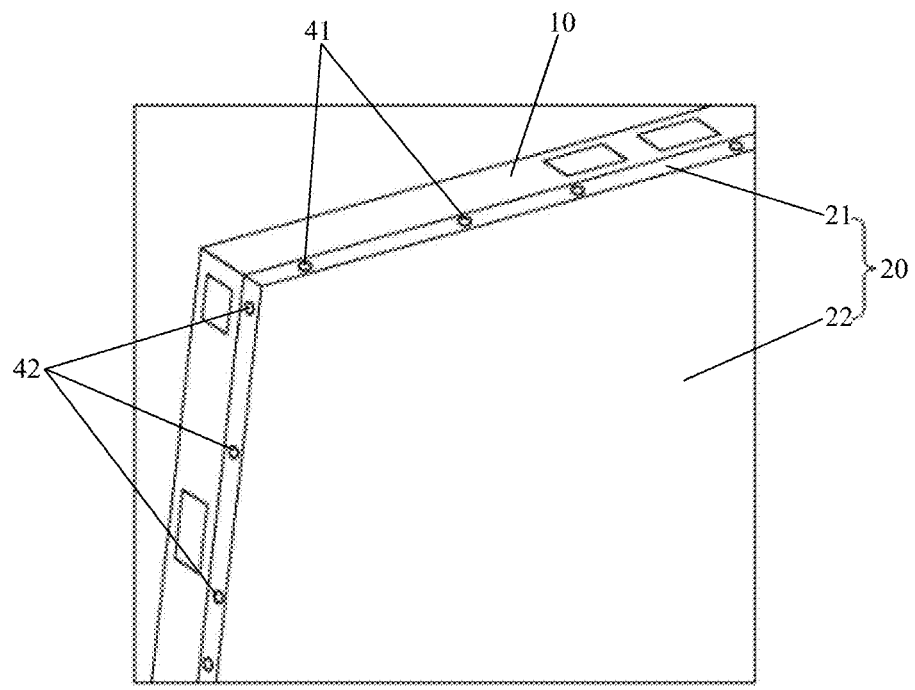
FIG. 19 is a partial structural diagram of a splicing display device according to some embodiments of the present disclosure, and illustrates sides of a display module and a case.
Figure 20:
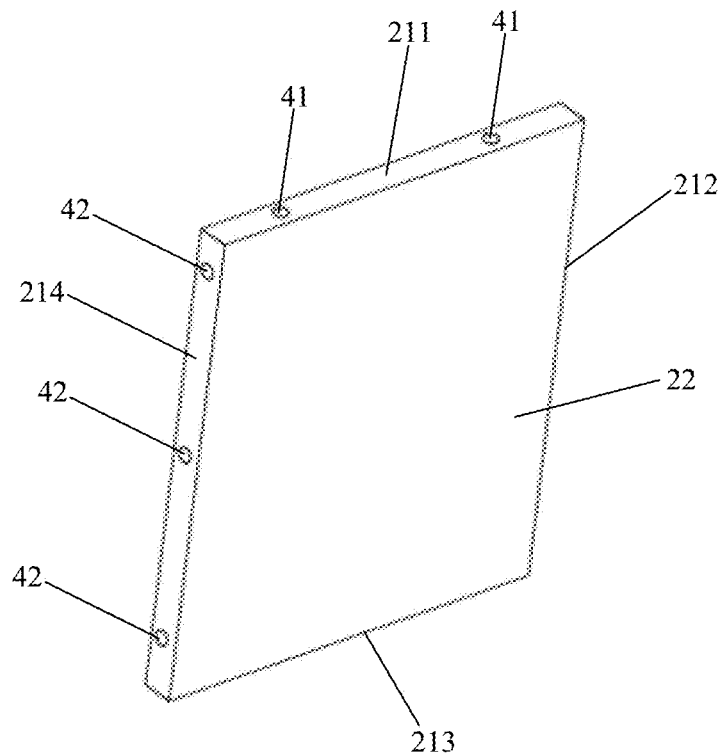
FIG. 20 is a structural diagram of the display module, a third connector and a fourth connector of the splicing display device shown in FIG. 19.

The embodiment of the present disclosure provides a splicing display device, as shown in FIGS. 1 and 19, the splicing display device includes a case 10 and a plurality of display modules 20 disposed on the case 10, and a display product having a complete display surface may be obtained after the plurality of display modules 20 are spliced on the case 10. The display module 20 may be a MiniLED-based display module or a MicroLED-based display module. In addition, as shown in FIGS. 19 and 20, the display module 20 includes a back shell 21 and a display substrate 22, the back shell 21 is connected to the case 10, and the display substrate 22 is disposed on a side of the back shell 21 away from the case 10. The display substrate 22 generally includes a substrate and a light emitting device disposed on the substrate, and the light emitting device is located on a side of the substrate away from the back shell 21. The type of the light emitting device is not limited, and may include but not limited to a plurality of LEDs. A material of the substrate is also not limited, and for example, the substrate may be a PCB substrate or a glass substrate. A display product formed by splicing display modules 20 having a glass substrate has higher display brightness, lower power consumption and more detailed display effect, and becomes a development trend of the display products nowadays.

Figure 3:
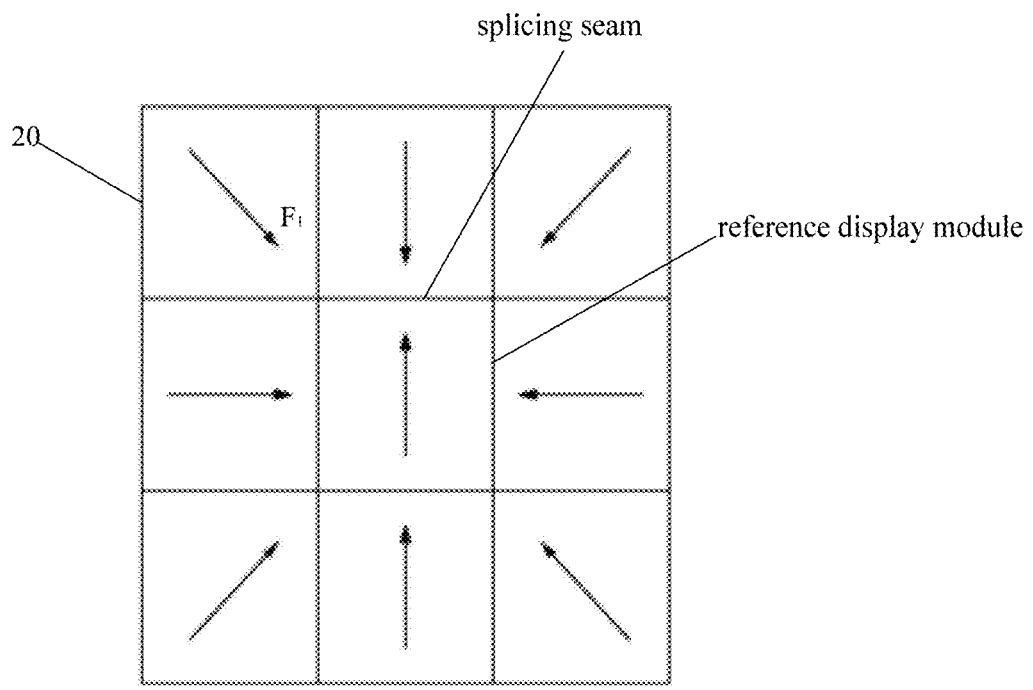
FIG. 3 is a schematic diagram illustrating force states of display modules of a splicing display device that is formed by splicing from center to periphery according to some embodiments of the present disclosure.

As shown in FIGS. 1, 2, 7, 8a to 8c, 9, 10 and 11a to 11c, in some embodiments, the splicing display device further includes a mounting structure 30 disposed between the case 10 and the display module 20. Specifically, the mounting structure 30 includes a first positioning assembly and a second positioning assembly, the first positioning assembly is disposed on a side of the case 10 facing the display module 20, and the second positioning assembly is disposed on a side of the display module 20 facing the case 10. Positions of the first positioning assembly and the second positioning assembly correspond to each other in a thickness direction of the display module 20, and the first positioning assembly and the second positioning assembly contact and fit in a direction parallel to a plane in which the display module 20 is located. A first pressing force $F_1$ can be applied to the whole corresponding display module 20 through the contact and fit between the first positioning assembly and the second positioning assembly (as shown in FIG. 3 to FIG. 4c), the first pressing force $F_1$ is parallel to the plane in which the display module 20 is located, and the display module 20 can be pushed by the first pressing force $F_1$ to automatically approach closely at least one display module 20 adjacent thereto along the direction of the first pressing force $F_1$, so as to reduce a splicing seam between the display module 20 and its adjacent display module 20. As a result, control of spacing between LEDs from adjacent display modules 20 after the splicing is facilitated, further, a display dark seam can be avoided, and the yield of splicing and assembling yield and display effect can be improved.

It should be noted that the specific structures and fit mode of the first positioning assembly and the second positioning assembly are not limited, and may be in any form capable of fitting in the direction parallel to the plane in which the display module 20 is located to provide the first pressing force $F_1$ to the display module 20.

As shown in FIGS. 1, 2, 7, 8a to 8c, 9, 10, and 11a to 11c, in some embodiments, the first positioning assembly includes a positioning pillar 31, and the positioning pillar 31 includes a first sidewall 312 and a second sidewall 313 opposite to each other. The second positioning assembly includes a positioning fitting member 32 and a pressing member 33. The positioning fitting member 32 has a positioning hole 321 provided along a thickness direction of the display module 20, and the positioning pillar 31 is configured to be inserted into the positioning hole 321. The pressing member 33 is disposed on the positioning fitting member 32 and at least partially located in the positioning hole 321. When the positioning pillar 31 is inserted into the positioning hole 321, a part of the pressing member 33 in the positioning hole 321 contacts and fits with the first sidewall 312 of the positioning pillar 31, so that the second sidewall 313 of the positioning pillar 31 is in contact with a hole wall of the positioning hole 321.

That is to say, the second sidewall 313 of the positioning pillar 31 can be pressed against the sidewall of the positioning hole 321 through the contact and fit between the part of the pressing member 33 in the positioning hole 321 and the first sidewall 312 of the positioning pillar 31, so that a relative position between the positioning pillar 313 and the positioning fitting member 32 is fixed, and mounting and positioning of the display module 20 on the case 10 can be realized. At the same time, the first pressing force $F_1$ can be applied to the whole corresponding display module 20 through the contact and fit between the pressing member 33 and the positioning pillar 31, the display module 20 is pushed by the first pressing force $F_1$ to automatically approach closely at least one display module 20 adjacent thereto along the direction of the first pressing force $F_1$, so as to reduce a splicing seam between the display module 20 and its adjacent display module 20.

It should be noted that in the specific embodiment shown in the drawings, the first positioning assembly includes the positioning pillar 31, the second positioning assembly includes the positioning fitting member 32 and the pressing member 33, that is, the positioning pillar 31 is arranged on the case 10, and the positioning fitting member 32 and the pressing member 33 are arranged on the display module 20 (specifically on the back shell 21 of the display module 20). Of course, it can be understood that in other embodiments not shown in the drawings, the first positioning assembly may include the positioning fitting member 32 and the pressing member 33, and the second positioning assembly may include the positioning pillar 31. In this case, the positioning fitting member 32 and the pressing member 33 are arranged on the case 10, and the positioning pillar 31 is arranged on the display module 20 (for example, on the back shell 21 of the display module 20).

In addition, it should be noted that, among the plurality of display modules 20, the mounting structure 30 may be provided between each display module 20 and the case 10. Alternatively, the mounting structure 30 may be provided between each of a part of the display modules 20 and the case 10, while the mounting structure 30 providing the first pressing force $F_1$ is not provided between the other of the display modules 20 and the case 10. In addition, the direction of the first pressing force $F_1$ on the whole of a single display module 20 is not limited, and may specifically be reasonably designed according to factors such as splicing way of the plurality of display modules 20, and directions of the first pressing forces $F_1$ on other display modules 20 adjacent to the display module 20, as long as it can be ensured that the display module 20 can automatically approach closely at least one display module 20 adjacent thereto to reduce the splicing seam therebetween in principle. Preferably, after designs such as which ones of the plurality of display modules 20 need to be applied with the first pressing force $F_1$ and which direction is the first pressing force $F_1$ in are determined, it can be ensured that each display module 20 of the plurality of display modules 20 can automatically closely approach every adjacent display module 20 thereof in an ideal state.

Thereinafter, various cases such as different splicing ways of the plurality of display modules 20, different force states of the display module 20, and different numbers and distributions of the mounting structures will be described for illustration with reference to FIGS. 3 to 6c. It should be noted that the expression of direction like "up," "down," "left," "right," "upper left," "lower left," "upper right," or "lower right" involved in the description refers to the direction in the drawings, rather than a direction of an actual product in the three-dimensional space.

As shown in FIG. 3, in some embodiments, one of the plurality of display modules 20 is a reference display module, and the remaining display modules 20 are spliced around the reference display module, that is, the plurality of display modules 20 are spliced together from the center to the periphery. The remaining display modules 20 other than the reference display module are disposed around the reference display module, and the directions of the first pressing forces $F_1$ received by the remaining display modules 20 are all toward the reference display module, that is, the remaining display modules 20 are all pushed toward the reference display module at the center.

Therefore, on one hand, the display modules 20 (e.g., four display modules 20 above, below, to the left, and to the right of the reference display module in FIG. 3) adjacent to the reference display module can closely approach the reference display module. On the other hand, the direction of the first pressing force $F_1$ received by each display module 20 that is not directly adjacent to the reference display module (e.g., the four display modules 20 located on the upper left, lower left, upper right, and lower right of the reference display module in FIG. 3) is also toward the reference display module, and thus the display module 20 can closely approach other display modules 20 adjacent thereto by pushing the display module 20 toward the reference display module by the first pressing force $F_1$.

It should be noted that, in the specific embodiment shown in FIG. 3, the direction of the first pressing force $F_1$ received by the reference display module is upward, the directions of the first pressing forces $F_1$ received by the four display modules 201 above, below; to the left, and to the right of the reference display module are respectively directed to the reference display module along a horizontal or a vertical direction, and the directions of the first pressing forces $F_1$ received by the four display modules 20 on the upper left, lower left, upper right and lower right of the reference display module are respectively directed to the reference display module along an inclined direction of approximately 45 degrees. Of course, it could be understood that in other embodiments not shown in the figures, the reference display module may not be applied with the first pressing force $F_1$. In addition, the specific angle of the direction of the first pressing force $F_1$ received by each remaining display module 20 around the reference display module is not limited, as long as the direction of the first pressing force $F_1$ is ensured to be approximately toward the reference display module.

Figure 4A:
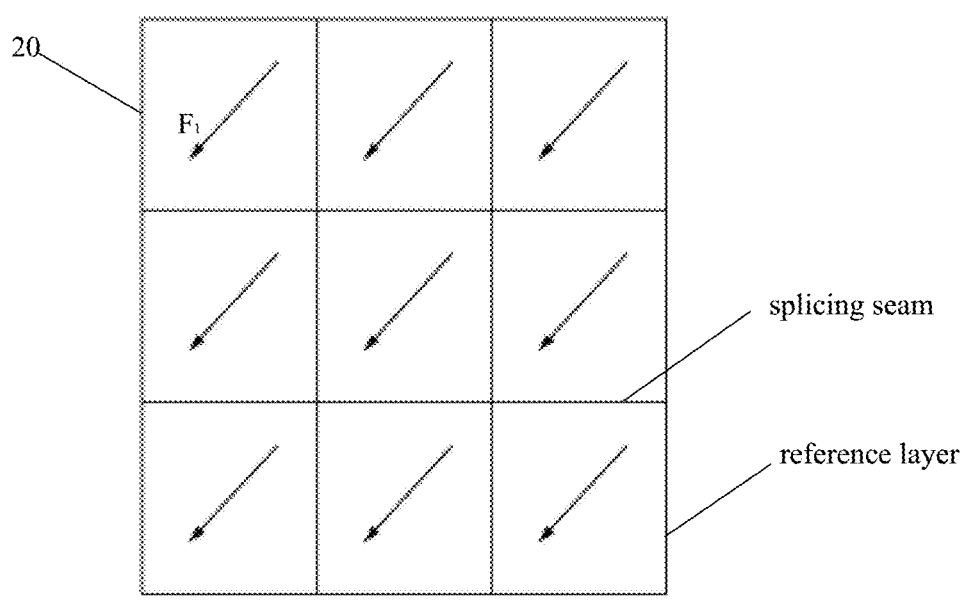
FIGS. 4a to 4c are schematic diagrams illustrating force states of display modules of splicing display devices formed by layer-by-layer splicing according to some embodiments of the disclosure, where
Figure 4B:
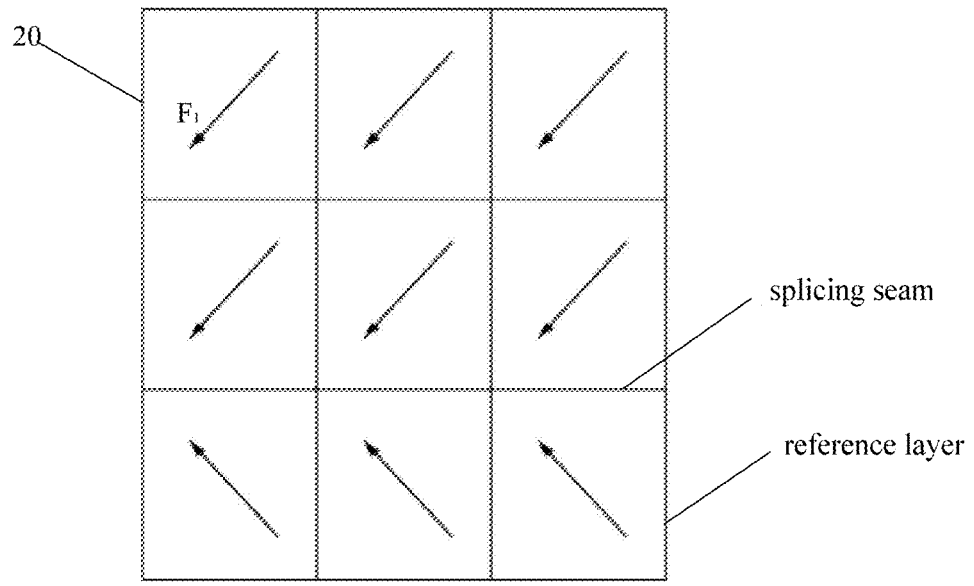
Figure 4C:
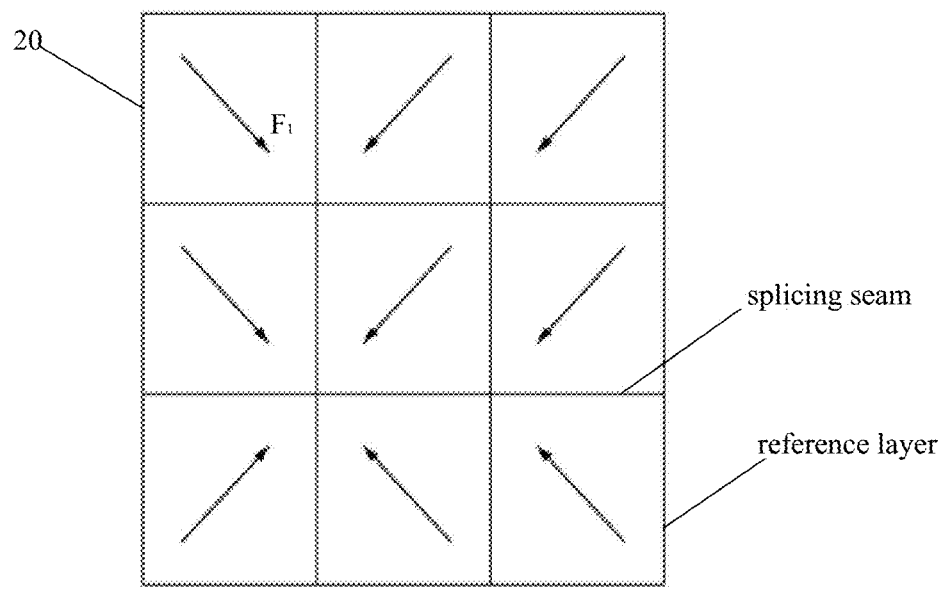

As shown in FIGS. 4a to 4c, in some embodiments, the plurality of display modules 20 are divided into a plurality of layers, of which one layer serves as a reference layer, and the other layers are spliced successively from at least one side of the reference layer. That is, in this case, the plurality of display modules 20 are spliced layer by layer from top to bottom, or from bottom to top, or from the middle to both sides. Here, the direction of the first pressing force $F_1$ received by each display module 20 of the other layers than the reference layer is directed toward the reference layer, that is, the display modules 20 of these layers are all pushed toward the reference layer, so that close approach between layers of the plurality of display modules 20 can at least be ensured. It can also be understood that the specific angle of the direction of the first pressing force $F_1$ received by each display module 20 of each layer is not limited, as long as the direction of the first pressing force $F_1$ received by each display module 20 of the other layers than the reference layer is ensured to be substantially toward the reference layer.

For example, in the specific embodiment shown in FIG. 4a, the direction of the first pressing force $F_1$ received by each display module 20 of the reference layer and the other layers is substantially toward the lower left, so that all of the display modules 20 are pushed toward the lower left after the splicing is completed.

For another example, in the specific embodiment shown in FIG. 4b, the direction of the first pressing force $F_1$ received by each display module 20 of the reference layer is substantially toward the upper left, and the direction of the first pressing force $F_1$ received by each display module 20 of the other layers is substantially toward the lower left, so that after the splicing is completed, each display module 20 of the reference layer is pushed toward the upper left, each display module 20 of the other layers is pushed toward the lower left, and the display modules 20 of the reference layer and the display modules 20 of a layer adjacent to the reference layer are pressed relatively tightly.

For another example, in the specific embodiment shown in FIG. 4c, the direction of the first pressing force $F_1$ received by the leftmost display module 20 of the reference layer is approximately toward the upper right, and the direction of the first pressing force $F_1$ received by each of the other display modules 20 of the reference layer is approximately toward the upper left. The direction of the first pressing force $F_1$ received by the leftmost display module 20 of each of the other layers is approximately toward the lower right, and the direction of the first pressing force $F_1$ received by each of the other display modules 20 of the other layers is approximately toward the lower left. After the splicing is completed, each display module 20 is pushed toward the corresponding direction, the display modules 20 of the reference layer and the display modules 20 of a layer adjacent to the reference layer are pressed relatively tightly, and the leftmost display module 20 of each of the reference layer and the other layers and its adjacent display module 20 of the same layer are pressed relatively tightly.

Figure 5A:
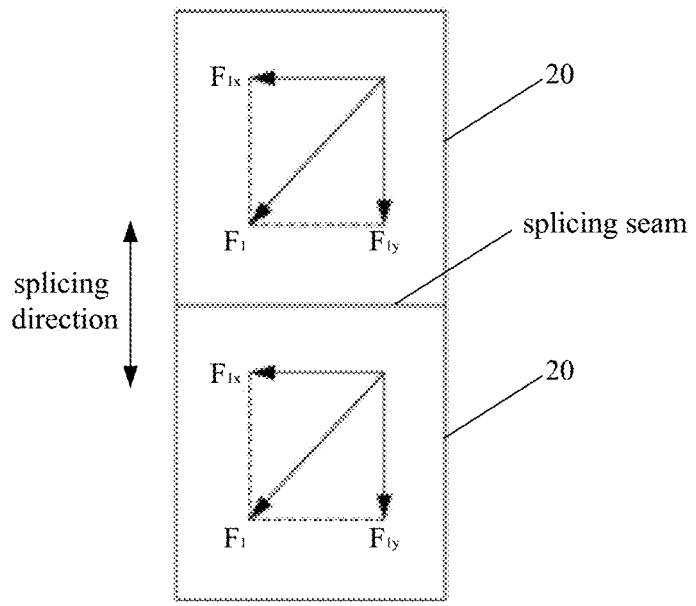
FIGS. 5a and 5b are force analysis diagrams of adjacent display modules of a splicing display device according to some embodiments of the present disclosure, where
Figure 5B:
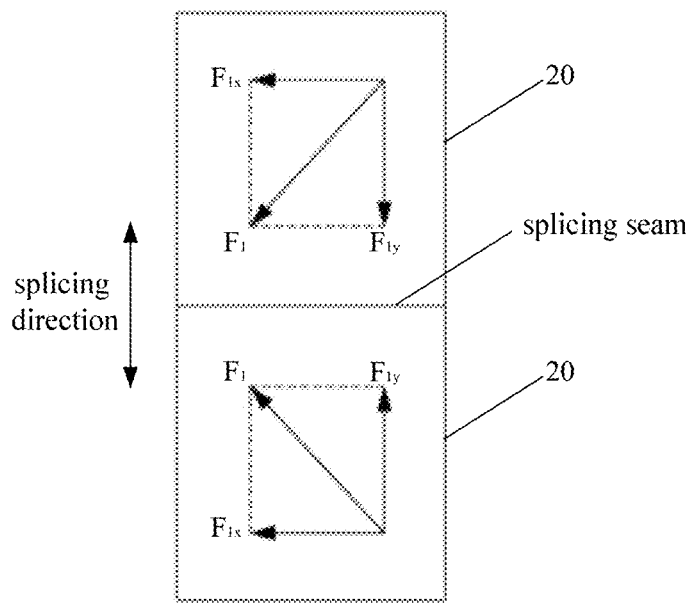

As shown in FIGS. 5a and 5b, in some embodiments, relationship between the first pressing forces $F_1$ respectively received by two adjacent display modules 20 is further defined. Specifically, in two adjacent display modules 20, component forces $F_{1x}$ of the first pressing forces $F_1$ respectively received by the two display modules 20 in an extending direction of a splicing seam between the two display modules 20 point towards a same direction, so that the two adjacent display modules 20 have movement trends in a same direction along the extending direction of the splicing seam, and the two display modules 20 are prevented from moving in opposite directions to avoid mismatch. In addition, in the two adjacent display modules 20, component forces $F_{1y}$ of the first pressing forces $F_1$ respectively received by the two display modules 20 in a splicing direction in which the two display modules are spliced point towards a same direction or point towards each other, in this way, it can be ensured that the two display modules 20 closely approach each other, and the problem of a too large splicing seam due to opposite directions of the component forces of the first pressing forces $F_1$ in the splicing direction can be prevented.

It should be noted that, if the first pressing force $F_1$ received by a display module 20 has the component force $F_{1x}$ and the component force $F_{1y}$, the direction of the first pressing force $F_1$ is inclined with respect to the splicing direction, and in this case, close approach between the display module 20 and two adjacent display modules 20 (e.g., the display modules 20 below and to the left of the said display module 20) can be realized simultaneously by the first pressing force $F_1$. If the first pressing force $F_1$ received by a display module 20 has only the component force $F_{1x}$ or the component force $F_{1y}$, close approach between the display module 20 and only one adjacent display module 20 (e.g., the display module 20 to the left of or below the said display module 20) can be realized by the first pressing force $F_1$. However, in this case, the above limitations on the component forces $F_{1x}$ or the component forces $F_{1y}$ of the adjacent display modules 20 are also applicable.

Figure 6A:
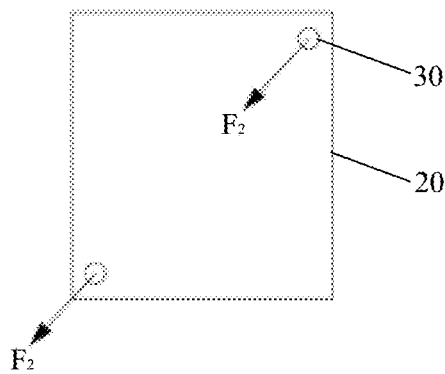
FIGS. 6a to 6c are schematic diagrams illustrating second pressing forces exerted by a plurality of mounting structures on a single display module of a splicing display device according to some embodiments of the present disclosure, where
Figure 6B:
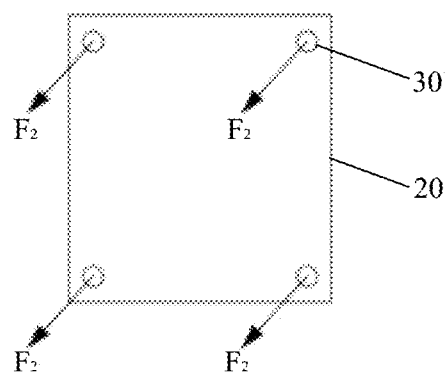
Figure 6C:
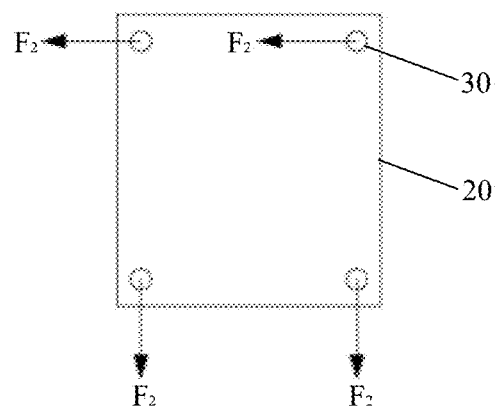
Figure 7:
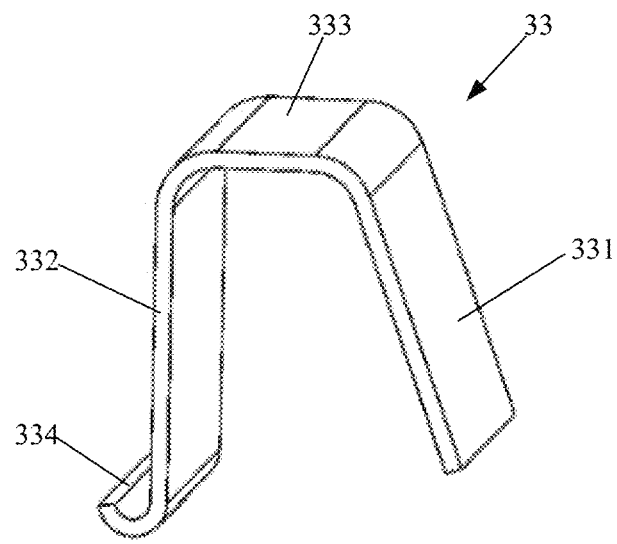
FIG. 7 is a schematic structural diagram of a compression spring of the splicing display device of FIG. 2.

As shown in FIGS. 6a to 6c, in some embodiments, a plurality of mounting structures 30 are disposed between each of at least one display module 20 and the case 10, the plurality of mounting structures 30 are disposed along a circumferential direction of the display module 20, and each mounting structure 30 is disposed close to an edge of the display module 20. Each mounting structure 30 applies a second pressing force $F_2$ to the display module 20 through the fit between the first positioning assembly and the second positioning assembly (for example, fit between the pressing member 33 and the positioning pillar 31), and the first pressing force $F_1$ received by the whole display module 20 is a resultant force of a plurality of second pressing forces $F_2$.

For example, in the specific embodiment shown in FIG. 6a, there are two mounting structures 30, the two mounting structures 30 are respectively located at two nonadjacent corners of the display module 20, two second pressing forces $F_2$ exerted by the two mounting structures 30 on the display module 20 are in a same direction (both are substantially toward the lower left), and the resultant force of the two second pressing forces $F_2$ forms a first pressing force $F_1$ in the same direction.

For another example, in the specific embodiment shown in FIG. 6b, there are four mounting structures 30, the four mounting structures 30 are respectively located at four corners of the display module 20, four second pressing forces $F_2$ exerted by the four mounting structures 30 on the display module 20 are in a same direction (all are substantially toward the lower left), and the resultant force of the four second pressing forces $F_2$ forms a first pressing force $F_1$ in the same direction.

For another example, in the specific embodiment shown in FIG. 6c, there are four mounting structures 30, and the four mounting structures 30 are respectively located at four corners of the display module 20. Two second pressing forces $F_2$ exerted by two upper mounting structures 30 on the display module 20 are in a same direction, that is, both are substantially toward the left. Two second pressing forces $F_2$ exerted by two lower mounting structures 30 on the display module 20 are in a same direction, that is, both are substantially downward. The resultant force of the four second pressing forces $F_2$ can form a first pressing force $F_1$ toward the lower left.

In addition, it should be noted that the direction of the second pressing force $F_2$ exerted by each mounting structure 30 on the display module 20 is related to the contact and fit between the first positioning assembly and the second positioning assembly. For example, in some embodiments, each mounting structure 30 generates a second pressing force $F_2$ through contact and fit between a part of the pressing member 33 located in the positioning hole 321 and the first sidewall 312 of the positioning pillar 31, in this case, a component force of a force exerted by the pressing member 33 on the positioning pillar 31 in the direction parallel to the plane in which the display module 20 is located forms a first acting force, and the positioning pillar 31 is pressed against the sidewall of the positioning hole 321 by the first acting force. In a case where the positioning pillar 31 is arranged on the display module 20 and the positioning fitting member 32 is arranged on the case 10, the second pressing force $F_2$ corresponding to the mounting structure 30 is the first acting force. In a case where the positioning pillar 31 is arranged on the case 10 and the positioning fitting member 32 is arranged on the display module 20, the second pressing force $F_2$ corresponding to the mounting structure 30 is a counter-acting force of the first acting force.

It should be noted that, after splicing and assembling of the plurality of display modules 20 are completed, the first pressing force $F_1$ applied to the corresponding display module 20 through the fit between the first positioning assembly and the second positioning assembly does not disappear, and the display module 20 automatically approaches closely with at least one display module 20 adjacent thereto under the action of the first pressing force $F_1$, so as to realize automatic compression and adjustment of splicing seams between modules after the plurality of display modules 20 are spliced together. Therefore, it can be understood that, in the embodiments in which the pressing member 33 is configured to fit with the positioning pillar 31, the specific structure and material of the pressing member 33 are not limited, and the pressing member 33 may be any pressing structure that can achieve the above function.

In some embodiments, the display module 20 is provided thereon with a first connector (not shown in the figure), the case 10 is provided thereon with a second connector (not shown in the figure), positions of the first connector and the second connector correspond to each other in the thickness direction of the display module 20, and the first connector and the second connector are connected by magnetic adsorption, so that the display module 20 is fixed on the case 10. The specific structures of the first connector and the second connector are not limited. In some embodiments, the first connector is a magnetic component, for example, the first connector includes a magnet, the magnet may include a layer including at least one of Fe, Ni, and Cr, or one or more magnetized elements of a magnet, and the magnet can be configured to generate a magnetic field. The second connector may be a component that can be magnetically adsorbed, for example, the second connector includes a metal body (for example, iron block, iron sheet) that can be adsorbed by the magnetic field generated by the magnet of the first connector; alternatively, the second connector includes a magnet whose magnetic pole is opposite to that of the magnet of the first connector. The constitution of the magnet included in the second connector is similar to that of the magnet of the first connector, and is not repeatedly described herein. Of course, it can be understood that in other embodiments, the second connector may be a magnetic component and the first connector may be a component that can be magnetically adsorbed.

In the related technology, in the process of splicing a plurality of display modules on the case, bump is inevitable, so that damage is easily caused to a display surface of the display module and to local LEDs at an edge of the display module, which affects the yield of splicing and assembling and is not conducive to controlling production costs. Although a display module having a PCB substrate has good edge strength, it is found that a certain splicing yield loss occurs in the actual assembly process. The splicing yield loss is more serious in the assembly process of a display module having a glass substrate, especially in a direct view display product using a display module having a glass substrate, side edges of the glass substrate often require wiring, and higher requirements for splicing operation of display modules are put forward in order to ensure that wires at the side edges of the glass substrate will not be damaged due to collision. It should be noted that if the display module and the case are connected, for example, by magnetic adsorption of the first connector and the second connector, bump of the display module is more likely to occur because an instantaneous magnetic attraction force along the thickness direction of the display module is large during the connection.

Figure 8A:
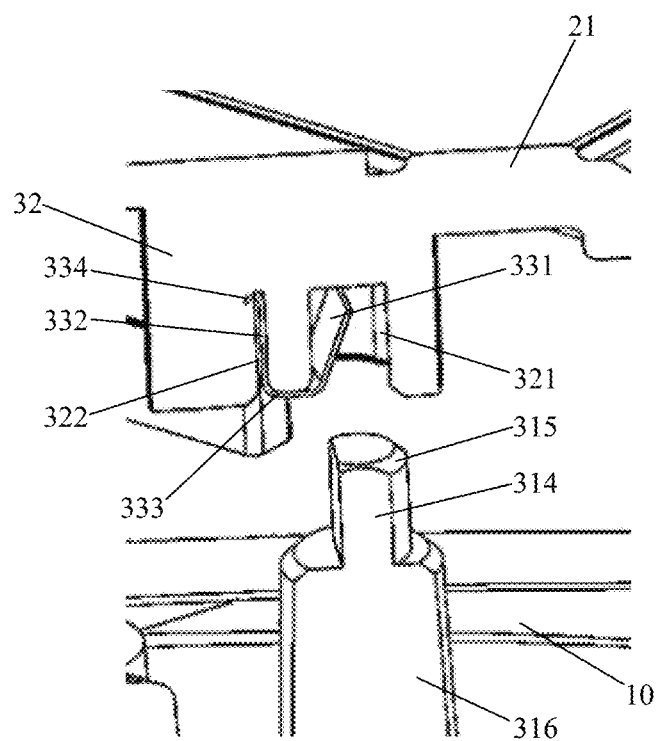
FIGS. 8a to 8c are schematic diagrams illustrating a fitting process between a compression spring and a positioning pillar of the splicing display device of FIG. 2.
Figure 11A:
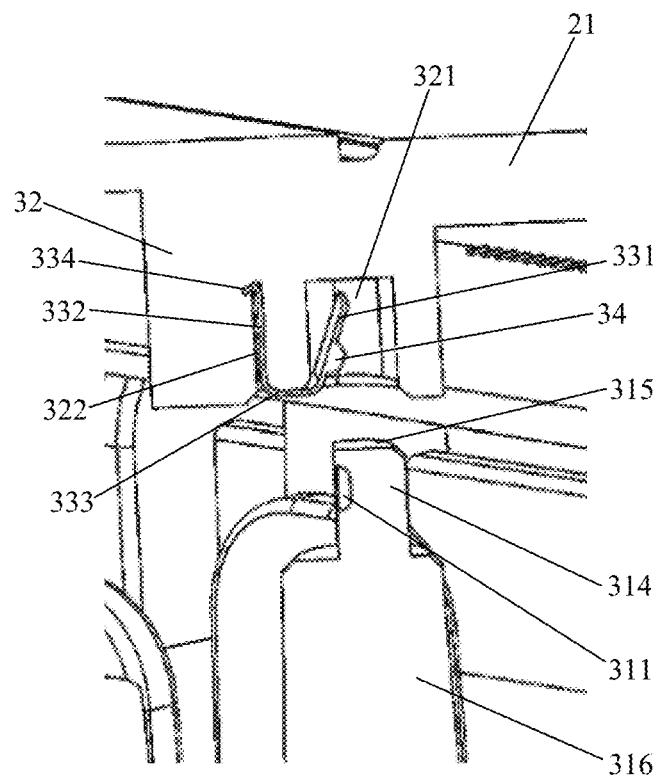
FIGS. 11a to 11c are schematic diagrams illustrating a fitting process between the compression spring and the positioning pillar of the splicing display device of FIG. 9.

As shown in FIGS. 2, 8a to 8c, 11a to 11c, 12 and 13, in some embodiments, the pressing member is a compression spring, the compression spring includes a pressing section 331, and the pressing section 331 is located in the positioning hole 321. The positioning hole 321 includes a first hole wall 3211 and a second hole wall 3212 disposed oppositely, and the pressing section 331 is located between the first hole wall 3211 and the second hole wall 3212. When the positioning pillar is not in contact with the pressing section 331, the pressing section 331 is in an initial state (as shown in FIGS. 8a and 11a). At this time, the pressing section 331 may be in a natural state in which no pressing deformation occurs, and of course, the pressing section 331 may be in a state in which slight pressing deformation occurs, that is, the pressing section 331 is pre-pressed during assembly.

Figure 8B:
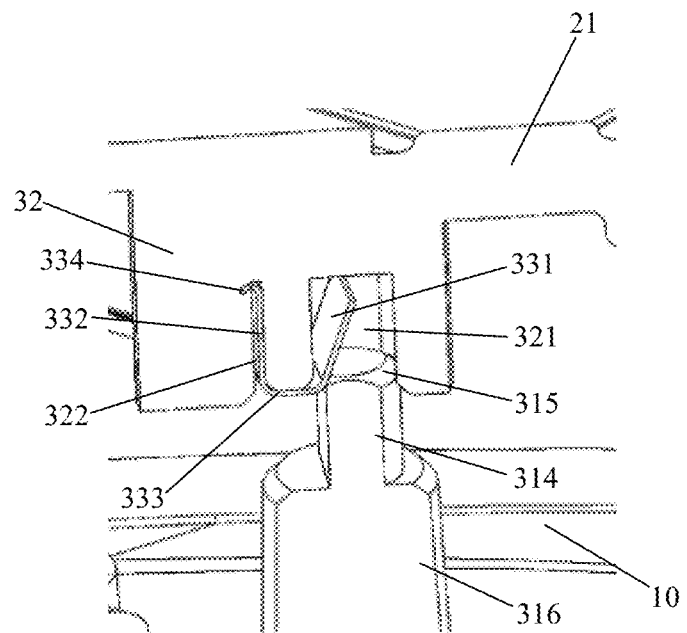
Figure 8C:
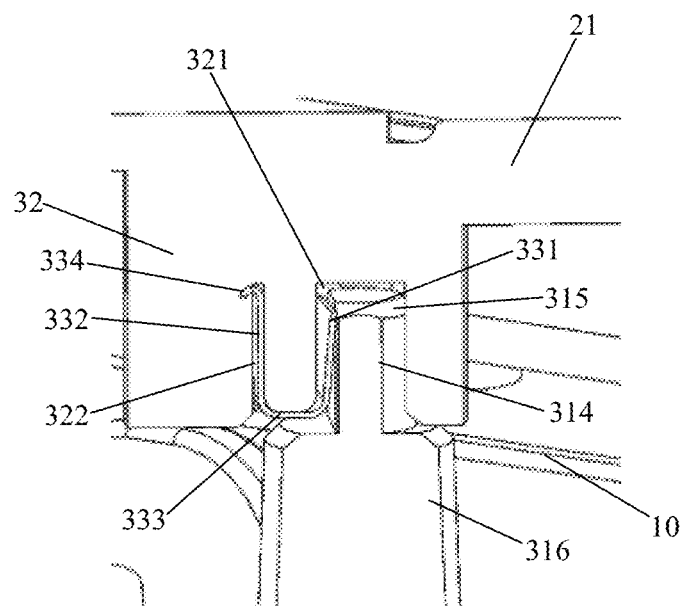
Figure 9:
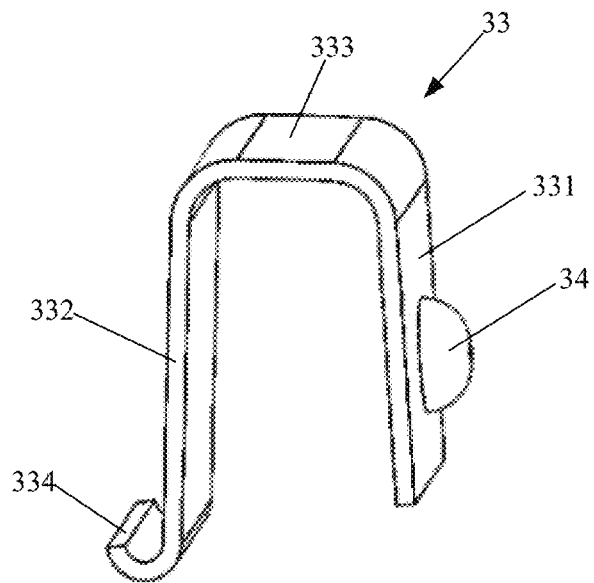
FIG. 9 is a schematic structural diagram of a compression spring of a splicing display device according to other embodiments of the present disclosure.
Figure 10:
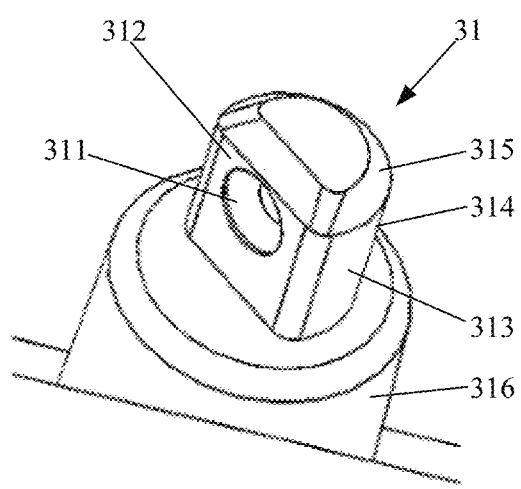
FIG. 10 is a schematic structural diagram of a positioning pillar of the splicing display device of FIG. 9.
Figure 11B:
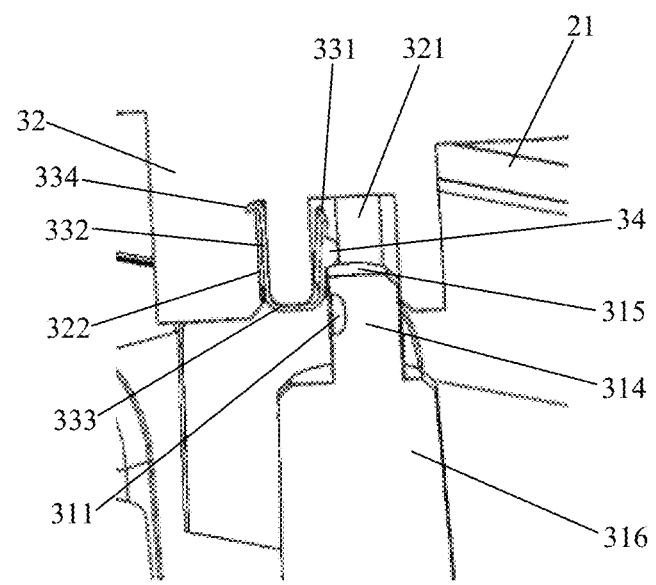
Figure 11C:
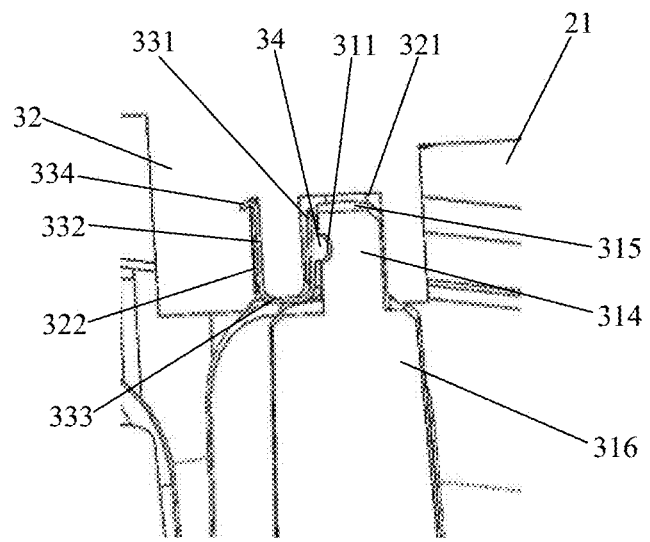
Figure 12:
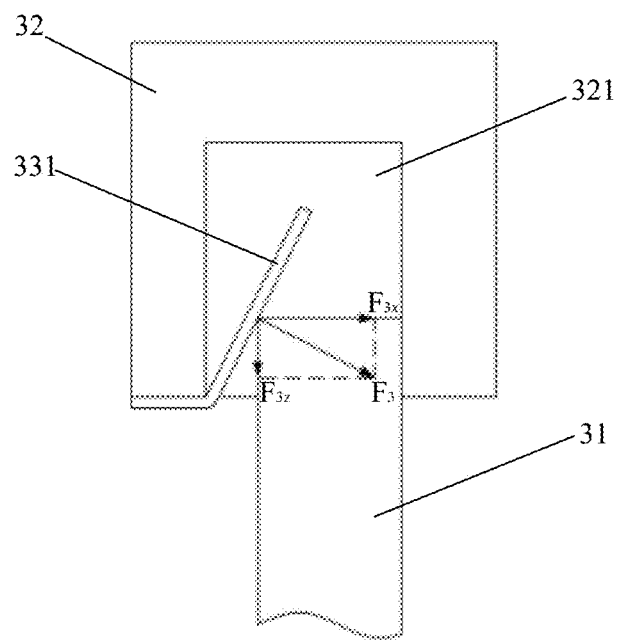
FIG. 12 is a schematic diagram illustrating force analysis and position relationship in a pressing process of a positioning pillar on a pressing section of a compression spring of a splicing display device according to some embodiments of the present disclosure.
Figure 13:
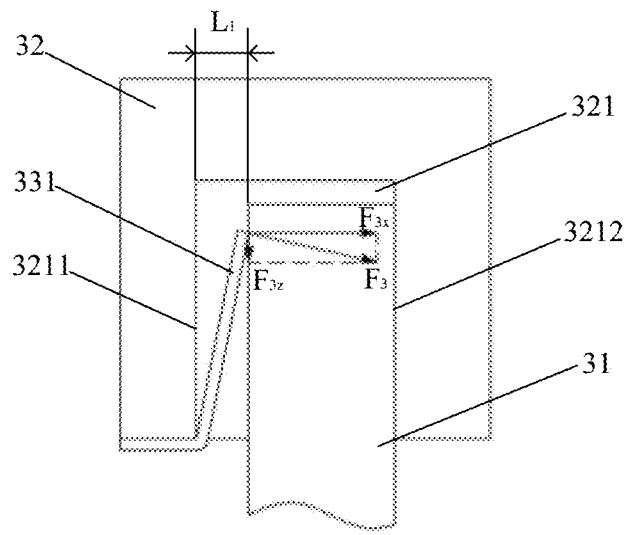
FIG. 13 is a schematic diagram illustrating force analysis and position relationship when the positioning pillar in FIG. 12 presses the pressing section into a first pressing state.

In a process of inserting the positioning pillar 31 into the positioning hole 321, the positioning pillar 31 contacts and fits with the pressing section 331. After the positioning pillar 31 comes into contact with the pressing section 331, the positioning pillar 31 gradually presses the pressing section 331 in a direction approaching the first hole wall 3211 (as shown in FIGS. 8b, 11b, and 12) as the positioning pillar 31 continues moving, so that the pressing section 331 gradually switches from the initial state to the first pressing state (as shown in FIGS. 8c, 11c and 13). The maximum distance between the pressing section 331 and the first hole wall 3211 when the pressing section 331 is in the first pressing state is smaller than the maximum distance between the pressing section 331 and the first hole wall 3211 when the pressing section 331 is in the initial state, that is, the pressing section 331 is closer to the first hole wall 3211 in the first pressing state than in the initial state. In fact, when the pressing section 331 is switched from the initial state to the first pressing state, the pressing section 331 gradually approaches the first hole wall 3211 under the pressure of the positioning pillar 31.

When the pressing section 331 is in the first pressing state, the pressing section 331 is in contact with the first sidewall 312, and thus presses the positioning pillar 313 such that the second sidewall 313 fits with the second hole wall 3212, thereby fixing a relative position between the positioning pillar 31 and the positioning fitting member 32. As shown in FIG. 13, when the pressing section 331 is in the first pressing state, a component force $F_{3x}$ of an elastic force $F_3$ applied to the positioning pillar 31 by the pressing section 331 in the direction parallel to the plane in which the display module 20 is located forms a first acting force, and the positioning pillar 31 is pressed against the second hole wall 3212 by the first acting force. After splicing and assembling of the plurality of display modules 20 is completed, the pressing section 331 is always in the first pressing state, that is, the component force $F_{3x}$ of the elastic force $F_3$ applied to the positioning pillar 31 by the pressing section 331 does not disappear, so that the display module 331 is automatically pushed by the first pressing force $F_1$ finally formed by the component force $F_{3x}$.

In addition, as shown in FIG. 12, when the pressing section 331 is switched from the initial state to the first pressing state, a component force $F_{3z}$ of the elastic force $F_3$ applied to the positioning pillar 31 by the pressing section 331 in the thickness direction of the display module 20 forms a second acting force, and the second acting force has a direction opposite to a movement direction in which the positioning pillar 31 is inserted into the positioning hole 321. The second acting force serves as a resistance during splicing and assembling of the display module 20, so that the splicing and assembling of the display module 20 can be more stable, thereby reducing the risk of collision of the display module 20. In some embodiments, the display module 20 and the case 10 are magnetically connected by the first connector and the second connector, and a magnetic attraction force between the first connector and the second connector is substantially in the thickness direction of the display module 20. Therefore, the second acting force can counteract part of the magnetic attraction force, thereby reducing the risk of collision of the display module 20 caused by a too large instantaneous magnetic attraction force.

It should be noted that, when the pressing section 331 is in the first pressing state, there is a certain requirement for the component $F_{3z}$ of the elastic force $F_3$ applied to the positioning pillar 31 by the pressing section 331 in the thickness direction of the display module 20, that is, in this case, the component $F_{3z}$ should be smaller than the magnetic attraction force between the display module 20 and the case 10, so as to ensure that the display module 20 and the case 10 can be effectively connected by the magnetic attraction force. In an ideal state, when the pressing section 331 is in the first pressing state, the component force $F_{3z}$ should be zero or close to zero, so as not to affect the magnetic attraction force between the display module 20 and the case 10.

As shown in FIGS. 9, 10 and 11a to 11c, in some embodiments, the mounting structure 30 further includes a first limiter and a second limiter, the first limiter is disposed on a side of the pressing section 331 facing the second hole wall 3212, and the second limiter disposed on the first sidewall 312 of the positioning pillar 31. When the pressing section 331 is in the first pressing state, the first limiter and the second limiter correspond to and fit with each other in the direction parallel to the plane in which the display module 20 is located, so as to limit positions of the pressing section 331 and the positioning pillar 31 in the thickness direction of the display module 20. In this case, on one hand, the pressing section 331 can press the positioning pillar 31 tightly; on the other hand, the first limiter and the second limiter fit with each other to provide a fixing force along the thickness direction of the display module 20, and the display module 20 and the case 10 can be connected and fixed with each other completely or mainly by the fixing force. Therefore, the first connector and the second connector may not be provided between the display module 20 and the case 10, or the first connector and the second connector provided between the display module 20 and the case 10 have relatively small magnetic attraction, in this way, not only costs can be saved, but also external magnetic interference along the thickness direction of the display module 20 during the splicing and assembling of the display module 20 can be avoided or reduced, which facilitates reducing difficulty in the splicing operation, improves efficiency of splicing and assembling, avoids collision of the display module 20 in the splicing and assembling, and greatly improves the yield of splicing and assembling.

It should be noted that the specific structures and fit mode of the first limiter and the second limiter are not limited, and may be in any form capable of providing a fixing force to the pressing section 331 and the positioning pillar 31 in the thickness direction of the display module 20.

As shown in FIGS. 9, 10 and 11a to 11c, in some embodiments, the first limiter includes a limit protrusion 34, and the second limiter includes a limit recess 311. When the pressing section 331 is in the first pressing state, the limit protrusion 34 is clamped into the limit recess 311 to connect the pressing section 331 and the positioning pillar 31 by clamping, so as to limit the positions of the pressing section 331 and the positioning pillar 31 in the thickness direction of the display module 20.

Further, as shown in FIGS. 9, 10 and 11a to 11c, in some embodiments, shapes and sizes of the limit protrusion 34 and the limit recess 311 match with each other, and a surface of the limit protrusion 34 is arcuate at least in the movement direction in which the positioning pillar 31 is inserted into the positioning hole 321. In the process of inserting the positioning pillar 31 into the positioning hole 321, the limit protrusion 34 having an arcuate surface can enter the limit recess 311 more easily to achieve clamping. Preferably, the surface of the limit protrusion 34 is integrally formed into a hemispherical surface, and a recess wall and a recess bottom surface of the limit recess 311 are also integrally formed into a hemispherical surface.

It should be noted that, in the specific embodiments shown in the figures, the first limiter includes the limit protrusion 34, and the second limiter includes the limit recess 311, that is, the limit protrusion 34 is disposed on the pressing section 331, and the limit recess 311 is disposed on the positioning pillar 31. Of course, it can be understood that, in other embodiments not shown in the figures, the first limiter may include the limit recess 311, and the second limiter may include the limit protrusion 34, in this case, the limit recess 311 is disposed on the pressing section 331, and the limit protrusion 34 is disposed on the positioning pillar 31.

Figure 14:
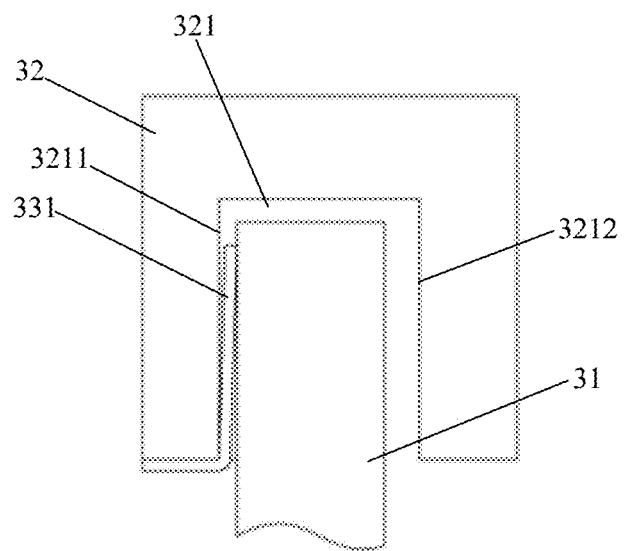
FIG. 14 is a schematic diagram illustrating positional relationship when the positioning pillar of FIG. 12 presses the pressing section into a second pressing state.
Figure 15:
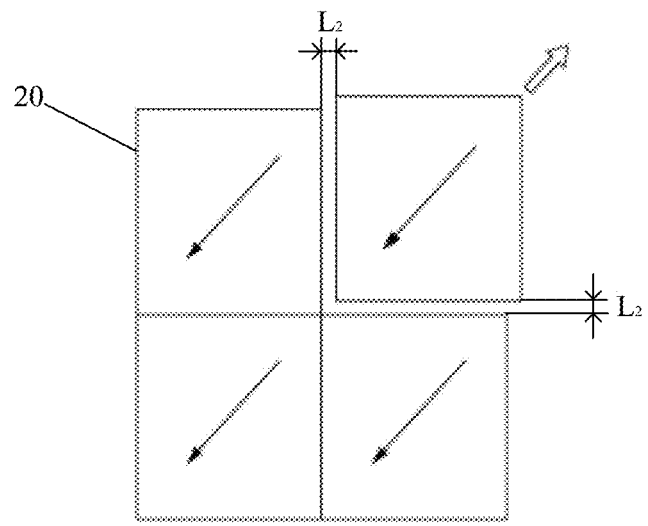
FIG. 15 is a schematic diagram illustrating positional relationship between a corresponding display module and its adjacent display modules when the pressing section of FIG. 14 is in the second pressing state.

As shown in FIGS. 13 to 15, in some embodiments, when the pressing section 331 is in the first pressing state, adjacent display modules closely approach each other after splicing of the plurality of display modules 20 is completed. At this time, there is a movable distance $L_1$ between the pressing section 331 and the first hole wall 3211, that is, the pressing section 331 can be further pressed in the direction close to the first hole wall 3211. Therefore, by controlling the corresponding display module 20 to move laterally in a direction away from at least one display module 20 adjacent thereto (that is, to move in a plane parallel to the plane in which the display module 20 is located), the positioning pillar 31 can be driven to move in the direction close to the first hole wall 3211, and the pressing section 331 is switched from the first pressing state to a second pressing state through the contact and fit between the positioning pillar 31 and the pressing section 331. The maximum distance between the pressing section 331 and the first hole wall 3211 when the pressing section 331 is in the second pressing state is smaller than the maximum distance between the pressing section 331 and the first hole wall 3211 when the pressing section 331 is in the first pressing state, that is, the pressing section 331 is closer to the first hole wall 3211 in the second pressing state than in the first pressing state. In the above process, the display module 20 moves laterally in the direction away from at least one display module 20 adjacent thereto, and when the pressing section 331 is in the second pressing state, the display module 20 moves laterally by a preset distance $L_2$, where the preset distance $L_2$ is less than or equal to the movable distance $L_1$.

On one hand, in a disassembling process of the display module 20, after the display module 20 is adsorbed and fixed by a tool such as a suction cup, the display module 20 can be controlled to move laterally. Specifically, the display module 20 can be controlled to move in a direction opposite to that of the component force $F_{3x}$ of the elastic force $F_3$ applied by the pressing section 331 in the direction parallel to the plane where the display module 20 is located, so as to be spaced apart from its adjacent display module 20 by the preset distance $L_2$, thereby reducing the risk of damage to side wires of the display module 20 during disassembly and maintenance. On the other hand, a hole diameter of the positioning hole 321 is larger than an outer diameter of the positioning pillar 31 (the hole diameter of the positioning hole 321 is approximately equal to the sum of the outer diameter of the positioning pillar 31 and the movable distance $L_1$), which further facilitates the operation of inserting the positioning pillar 31 into the positioning hole 321, thereby improving convenience of the splicing operation.

Figure 16:
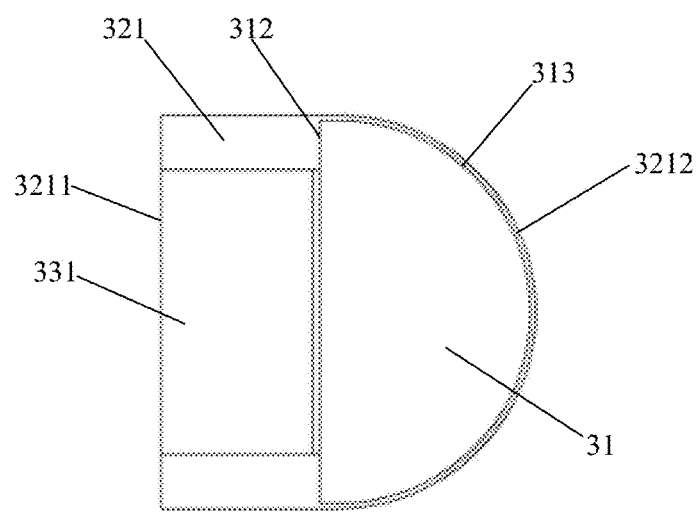
FIG. 16 is a top view of the pressing section, the positioning pillar and the positioning hole when the pressing section of FIG. 13 is in the first pressing state.

In particular, as shown in FIG. 16, in some embodiments, cross sections of the second sidewall 313 of the positioning pillar 31 and the second hole wall 3212 of the positioning hole 321 match with each other in shape and size. For example, the cross section of the second sidewall 313 and the cross section of the second hole wall 3212 are both arcuate in shape and have substantially a same curvature. Alternatively, the cross section of the second sidewall 313 and the cross section of the second hole wall 3212 are both linear in shape, and have substantially a same length or the length of the cross section of the second sidewall 313 is slightly smaller than the length of the cross section of the second hole wall 3212. When the pressing section 331 is in the first pressing state, the pressing section 331 can press the positioning pillar 31 tightly and make the second sidewall 313 fit with and contact the second hole wall 3212. In this case, the positioning pillar 31 is in surface contact with the second hole wall 3212, which is more favorable for fixing and fit between the positioning pillar 31 and the positioning fitting member 32. Of course, in other embodiments not shown in the figures, when the pressing section 331 is in the first pressing state, the positioning pillar 31 and the second hole wall 3212 may be in line contact, for example, the cross section of the second sidewall 313 and the cross section of the second hole wall 3212 are both arcuate in shape, but the cross section of the second sidewall 313 has a curvature greater than that of the cross section of the second hole wall 3212, and in this case, the second sidewall 313 and the second hole wall 3212 are in line contact.

Figure 17:
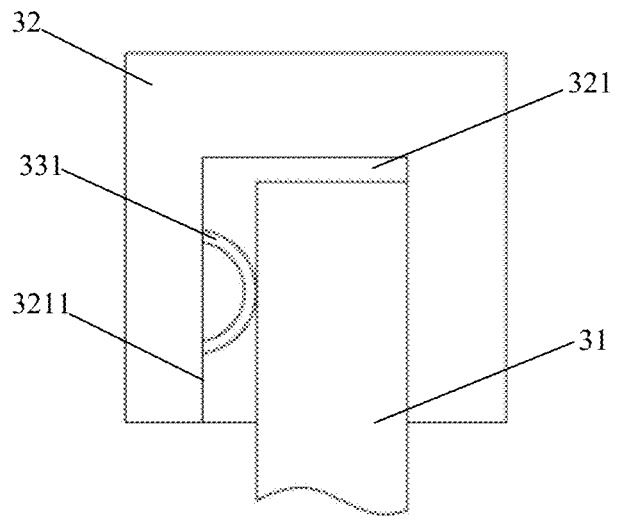
FIG. 17 is a schematic diagram illustrating fit between a positioning pillar and an arcuate pressing section of a splicing display device according to some other embodiments of the present disclosure.

As shown in FIGS. 7, 8a, 9 and 11a, in some embodiments, a first end of the pressing section 331 is disposed at an entry of the positioning hole 321, a second end of the pressing section 331 extends in a direction away from the entry, and the second end of the pressing section 331 is a free end. Here, the "entry of the positioning hole 321" includes a part (can be regarded as being located in the positioning hole 321) of the first hole wall 3211 located near the hole entry, a part (can be regarded as being located outside the positioning hole 321), located near the hole entry, of a surface of the positioning fitting member 321 facing the positioning pillar, and an edge of the hole entry of the positioning hole 321. When the pressing section 331 is in the initial state, a distance between the pressing section 331 and the first hole wall 3211 gradually increases in a direction from the first end to the second end of the pressing section 331, and at this time, the pressing section 331 is in a natural state in which no pressure is applied. Of course, the structure and arrangement of the pressing section 331 is not limited thereto. In other embodiments, any pressing structure capable of providing an elastic force may be adopted. For example, as shown in FIG. 17, in other embodiments, the pressing section 331 is arcuate as a whole, and two ends of the arcuate pressing section 331 are respectively fixed to the first hole wall 3211. When the pressing section 331 is in the initial state, a distance between the highest point of the arcuate pressing section 331 and the second hole wall 3212 is less than the outer diameter of the positioning pillar 31, so that the pressing section 331 can be pressed after the positioning pillar 31 is inserted into the positioning hole 321.

As shown in FIGS. 7 to 9 and 11a to 11c, in some embodiments, the positioning fitting member is further provided with a fixing recess 322 spaced apart from the positioning hole 321, the compression spring further includes a fixing section 332 and an intermediate section 333 connected between the fixing section 332 and the pressing section 331, the fixing section 332 is inserted into and connected with the fixing recess 322, and the intermediate section 333 is located on a side of the positioning fitting member facing the positioning pillar 331. When the positioning pillar 31 presses the pressing section 331, the compression spring provides an elastic force mainly through deformation of the pressing section 331 and the intermediate section 333. It should be noted that the intermediate section 333 can be fixedly connected with the surface of the positioning fitting member 32 facing the positioning pillar 31, so that the two always fit with each other. Alternatively, the intermediate section 333 and the surface of the positioning fitting member 32 facing the positioning pillar 31 are not connected, and there is always a certain gap therebetween. Alternatively, the intermediate section 333 is not connected with the surface of the positioning fitting member 32 facing the positioning pillar 31, when the pressing section 331 is not pressed, the intermediate section 333 fits with the surface of the positioning fitting member 32, and when the pressing section 331 is pressed, a certain gap may be generated between the intermediate section 333 and the surface of the positioning fitting member 32.

Further, as shown in FIGS. 7 to 9 and 11a to 11c, in some embodiments, an end of the fixing section 332 away from the intermediate section 333 is provided with a hook 334, and the hook 334 is embedded in a sidewall of the fixing recess 322, so that the fixing section 332 and the fixing recess 322 are fixedly connected. A bending direction of the hook 334 may be a direction facing away from or toward the pressing section 331. Of course, it can be understood that the structure and fixing way of the compression spring are not limited thereto. In other embodiments not shown in the figures, the compression spring may be any spring structure that can provide an elastic force to the positioning pillar 31 through the pressing section 331, for example, the compression spring includes only the pressing section 331, and the first end of the pressing section 331 is directly fixed to the first hole wall 3211 through a fastener such as a screw.

Figure 18:
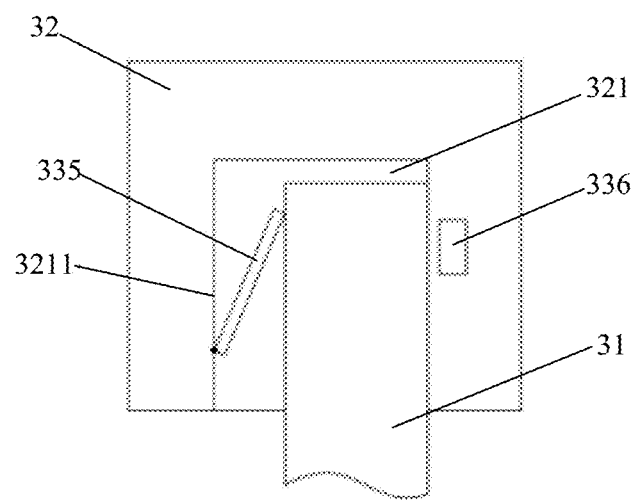
FIG. 18 is a schematic diagram illustrating fit among a positioning pillar, a pressing plate and a first magnetic adsorption structure of a splicing display device according to some other embodiments of the present disclosure.

As shown in FIG. 18, in some embodiments, the pressing member 33 may not use the compression spring. Specifically, the pressing member 33 includes a pressing plate 335 and a first magnetic adsorption structure 336. The first magnetic adsorption structure 336 is a magnetic component, for example, the first magnetic adsorption structure 336 includes a magnet, the magnet may include a layer including at least one of Fe, Ni, and Cr, or one or more magnetized elements of a magnet, and the magnet can be configured to generate a magnetic field. The pressing plate 335 may be a component that can be magnetically adsorbed, for example, the pressing plate 335 includes a metal body (for example, iron block, iron sheet) that can be adsorbed by the magnetic field generated by the magnet of the first magnetic adsorption structure 336; alternatively, the pressing plate 335 includes a magnet whose magnetic pole is opposite to that of the magnet of the first magnetic adsorption structure 336. The constitution of the magnet included in the pressing plate 335 is similar to that of the magnet of the first magnetic adsorption structure 336, and is not repeatedly described herein. A first end of the pressing plate 335 is rotatably connected to the first hole wall 3211, a second end of the pressing plate 335 contacts and fits with the positioning pillar 31, the first magnetic adsorption structure 336 is embedded in the second hole wall 3212, and there is always a magnetic attraction force between the first magnetic adsorption structure 336 and the pressing plate 335, so that the pressing plate 335 presses the positioning pillar 31 against the second hole wall 3212, and the magnetic attraction force can finally form the first pressing force $F_1$ pushing the display module 20.

As shown in FIGS. 8a to 8c and 10a to 11c, in some embodiments, the positioning pillar 31 includes a main body 314 and a guide end 315, the guide end 315 is disposed on a side of the main body 314 facing the positioning fitting member 32, and the guide end 315 has a cross section whose area gradually decreases along a movement direction in which the positioning pillar 31 is inserted into the positioning hole 321. The guide end 315 can play a guiding role in the process of inserting the positioning pillar 31 into the positioning hole 321, thereby facilitating improvement of operation convenience. In addition, the positioning pillar 31 further includes a connection portion 316 configured to be connected to the case 10 or the back shell 21, the main body 314 is connected between the guide end 315 and the connection portion 316. An outer diameter of the connection portion 316 is larger than an outer diameter of the main body 314, and an annular step is thus formed between the connection portion 316 and the main body 314.

As shown in FIGS. 19 to 22, in some embodiments, in two adjacent display modules 20, a third connector 41 and a fourth connector 42 are respectively disposed on opposite sides of the two display modules 20, positions of the third connector 41 and the fourth connector 42 correspond to each other in the splicing direction of the two display modules 20, and the third connector 41 and the fourth connector 42 are connected by magnetic attraction. The opposite sides of the two adjacent display modules 20 are attracted together by a magnetic attraction force $F_4$ generated by interaction between the third connector 41 and the fourth connector 42, so that the adjacent display modules 20 further closely approach, thereby avoiding the problem of a too large splicing seam therebetween.

The specific structures of the third connector 41 and the fourth connector 42 is not limited. In some embodiments, the third connector 41 is a magnetic component, for example, the third connector 41 includes a magnet, the magnet may include a layer including at least one of Fe, Ni, and Cr, or one or more magnetized elements of a magnet, and the magnet can be configured to generate a magnetic field. The fourth connector 42 may be a component that can be magnetically adsorbed, for example, the fourth connector 42 includes a metal body (for example, iron block, iron sheet) that can be adsorbed by the magnetic field generated by the magnet of the third connector 41; alternatively, the fourth connector 42 includes a magnet whose magnetic pole is opposite to that of the magnet of the third connector 41. The constitution of the magnet included in the fourth connector 42 is similar to that of the magnet of the third connector 41, and is not repeatedly described herein. Of course, it can be understood that in other embodiments, the fourth connector 42 may be a magnetic component and the third connector 41 may be a component that can be magnetically adsorbed.

It should be noted that, in general, the third connector 41 and the fourth connector 42 are provided on sides of the back shell 21. The specific number and arrangement of the third connectors 41 and the fourth connectors 42 are not limited, as long as it is ensured that positions of the third connectors 41 and the fourth connectors 42 respectively on opposite sides of the adjacent display modules are in one-to-one correspondence and the third connectors 41 and the fourth connectors 42 are attracted to each other during the splicing.

Figure 21:
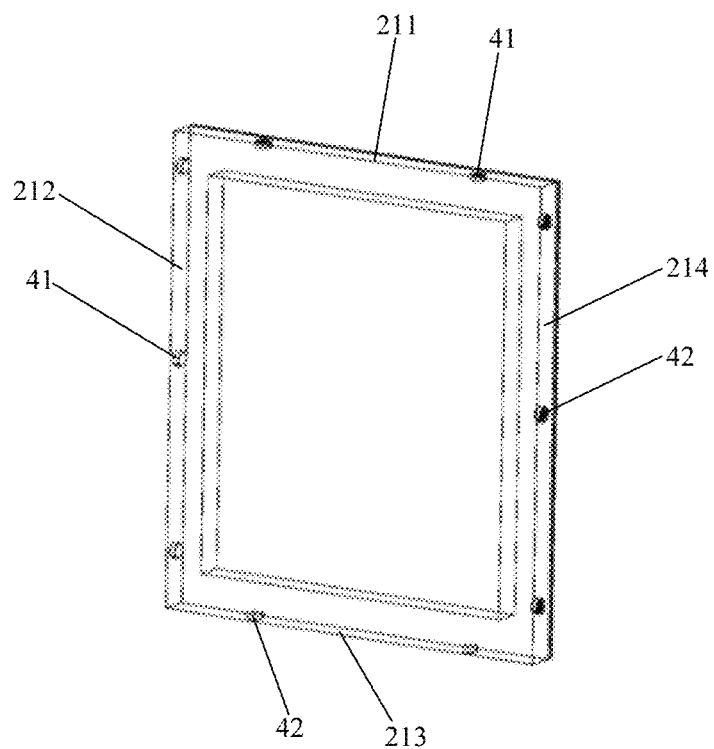
FIG. 21 is a structural diagram of a back shell, the third connector and the fourth connector of the display module of FIG. 20.
Figure 22:
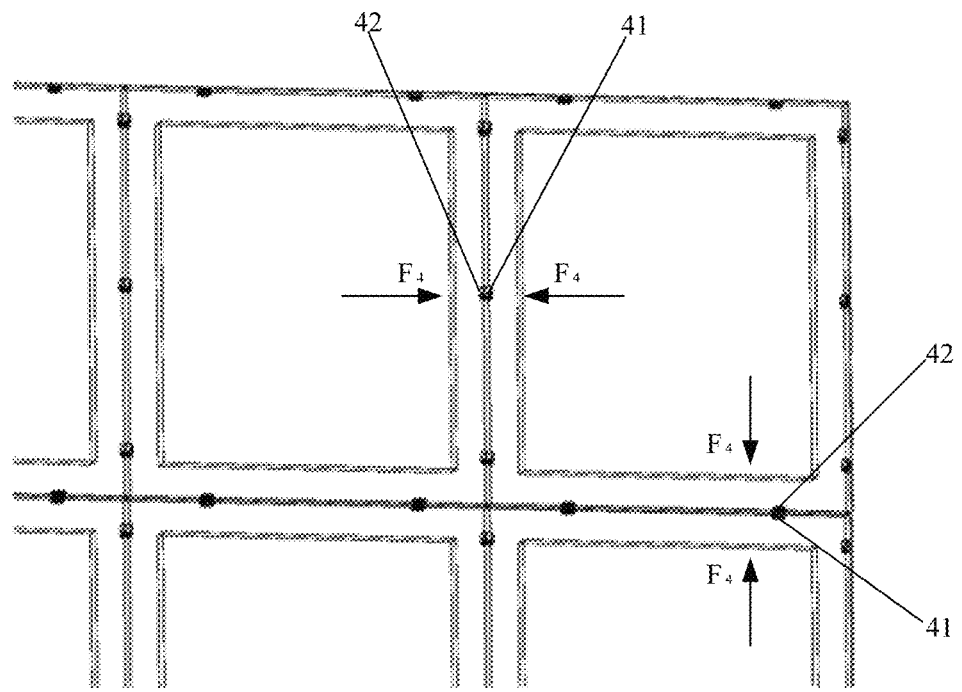
FIG. 22 is a schematic diagram illustrating force states of the third connector and the fourth connector adsorptively connected after the plurality of display modules of the splicing display device of FIG. 19 are spliced.
Figure 23:
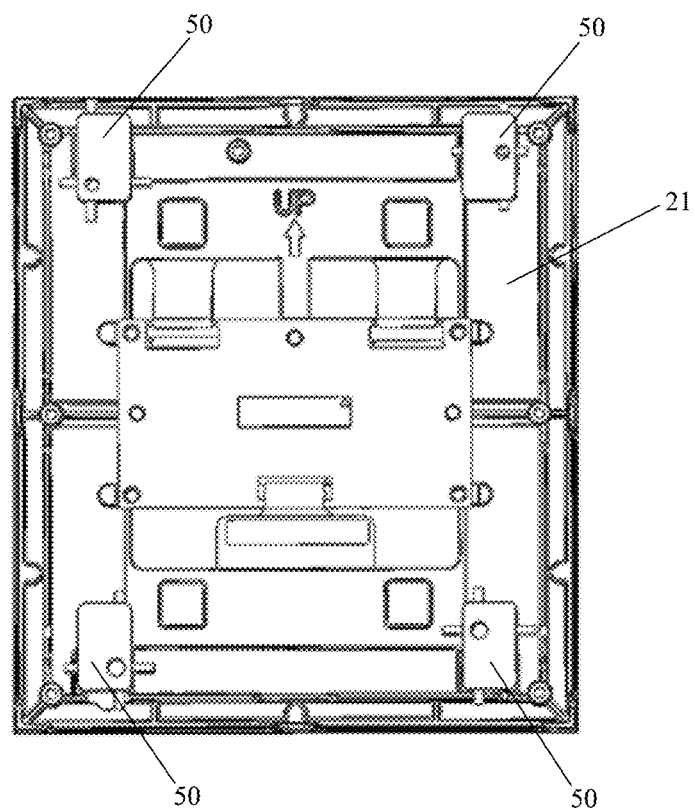
FIG. 23 is a schematic structural diagram of a display module and a leveling structure of a splicing display device according to some embodiments of the present disclosure.

As shown in FIGS. 20 to 22, in some embodiments, each display module 20 is rectangular, and the back shell 21 of each display module 20 includes a first side 211, a second side 212, a third side 213, and a fourth side 214 sequentially connected. Each of the first side 211 and the second side 212 is provided with at least one third connector 41, and each of the third side 213 and the fourth side 214 is provided with at least one fourth connector 42. Preferably, the number of the third connectors 41 on the first side 211 and the number of the fourth connectors 42 on the third side 213 are the same and positions of the third connectors 41 on the first side 211 are in one-to-one correspondence with positions of the fourth connectors 42 on the third side 213; and the number of the third connectors 41 on the second side 212 and the number of the fourth connectors 42 on the fourth side 214 are the same and positions of the third connectors 41 on the second side 212 are in one-to-one correspondence with positions of the fourth connectors 42 on the fourth side 214. When a plurality of display modules 20 are assembled by splicing, each display module 20 is spliced at a same orientation (for example, the first side 211 of each display module 20 is at the top), so that it can be ensured that the third connectors 41 and the fourth connectors 42 between adjacent display modules 20 are adsorbed with their positions in one-to-one correspondence, thereby realizing quick splicing of the plurality of display modules 20.

In the related technology, in the plurality of display modules after the splicing, if there is a large difference in parallelism between at least two display modules, a segment gap between the two display modules does not meet the requirements, which will affect the yield of splicing assembling and display effect. Therefore, in this case, it is necessary to adjust the parallelism of the display modules. Generally, the parallelism of each display module can be adjusted by taking the case as a reference. However, as a common way to adjust the parallelism of the display module, the display module is detached from the case for adjusting. In this adjusting process, the display module may need to be disassembled and assembled repeatedly, which may cause damage to the display module.

As shown in FIGS. 23, 24, 25a and 25b, in some embodiments, the splicing display device further includes a leveling structure 50, a plurality of leveling structures 50 are disposed between each display module 20 and the case 10, and the plurality of leveling structures 50 are arranged along a circumferential direction of the display module 20. Preferably, four leveling structures 50 are disposed between each display module 20 and the case 10, and the four leveling structures 50 respectively correspond to four corners of the display module 20. The leveling structure 50 includes a first leveling assembly and a second leveling assembly. The first leveling assembly fits with a side of the case 10 facing the display module 20, and the second leveling assembly fits with a side of the display module 20 facing the case 10. Positions of the first leveling assembly and the second leveling assembly correspond to each other in the thickness direction of the display module 20, and the first leveling assembly and the second leveling assembly fit by driving. By operating the leveling structure 50 from a side of the splicing display device, a distance between a part of the display module 20 corresponding to the leveling structure 50 and the case 10 can be changed. After performing the above operation on at least one of the plurality of leveling structures 50, the parallelism of the display module 20 with respect to the case 10 can be adjusted to meet the requirements. The segment gap between the display modules 20 can be reduced after every display module 20 whose parallelism needs to be adjusted is adjusted according to the above process, so as to improve the yield of splicing and assembling and display effect. In addition, the leveling structure 50 can be operated from the side of the splicing display device, the display module 20 or the case 10 does not need to be disassembled, the operation is convenient, and the splicing display device can be applied to a front maintenance display product with insufficient rear operation space.

It should be noted that the specific structures and fit mode of the first leveling assembly and the second leveling assembly are not limited, and may be in any form capable of being operated from a side of the splicing display device to change the distance between the display module 20 and the case 10.

As shown in FIGS. 23, 24, 25a and 25b, in some embodiments, the first leveling assembly includes a mounting seat 51 and an adjusting member 52, the mounting seat 51 is disposed on the side of the case 10 facing the display module 20, the mounting seat 51 has a limit hole 511 provided along the thickness direction of the display module 20, a first end of the adjusting member 52 can be inserted into the limit hole 511 from a side of the mounting seat 51, and a second end of the adjusting member 52 is outside the mounting seat 51. The second leveling assembly includes a supporting member 53 disposed in the limit hole 511 and capable of moving up and down along the limit hole 511, a first end of the supporting member 53 is configured to fit with the side of the display module 20 facing the case 10, and the first end of the adjusting member 52 fits with a second end of the supporting member 53. By operating the second end of the adjusting member 52 from the side of the splicing display device, the adjusting member 52 can be driven to move in an extending direction thereof, and the supporting member 53 is driven to move up and down through the fit between the first end of the adjusting member 52 and the second end of the supporting member 53, so that the distance between the part of the display module 20 corresponding to the leveling structure 50 and the case 10 is changed.

Figure 24:
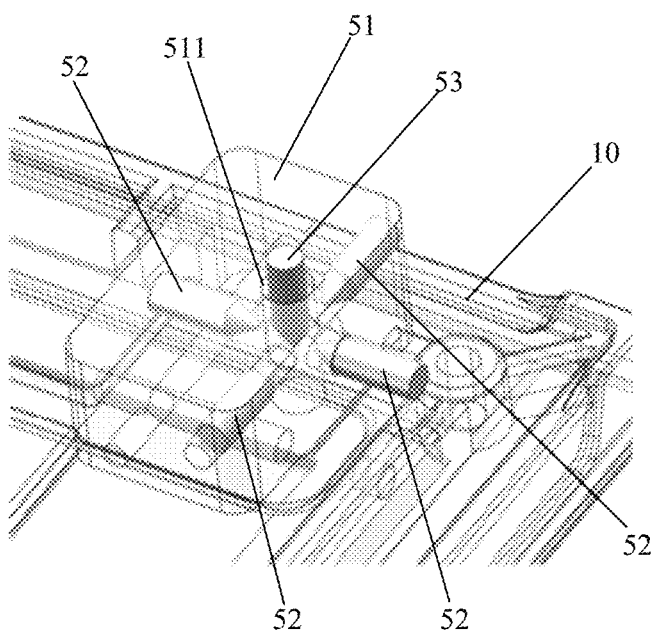
FIG. 24 is a schematic perspective view of the leveling structure of FIG. 23.
Figure 25A:
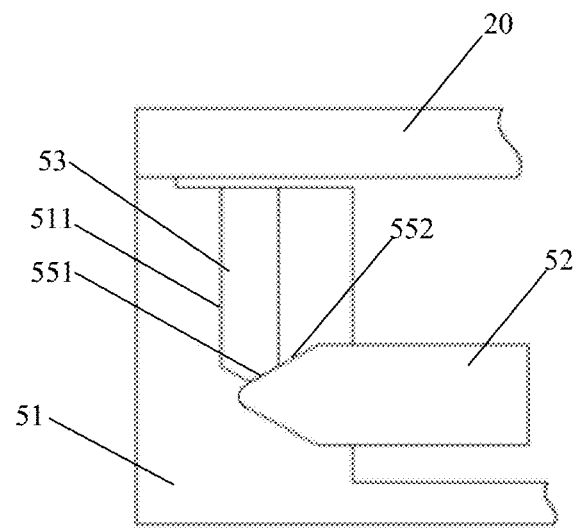
FIGS. 25a and 25b are schematic diagrams illustrating operating principle of the leveling structure of FIG. 23.
Figure 25B:
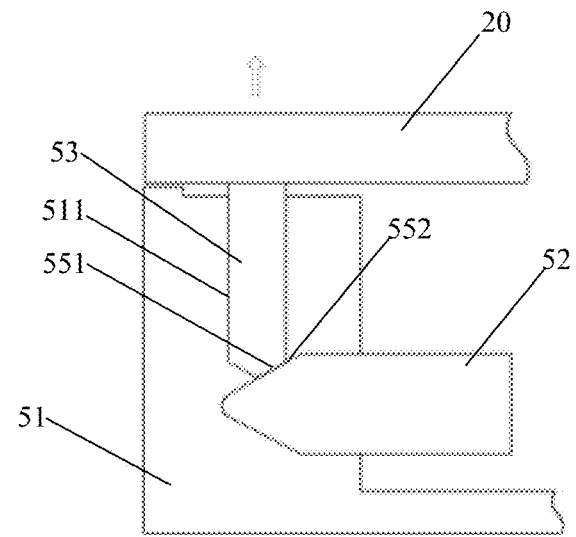

As shown in FIGS. 24, 25a and 25b, in some embodiments, the second end of the supporting member 53 is provided with a first inclined portion 551, the first end of the adjusting member 52 is provided with a second inclined portion 552, the first inclined portion 551 contacts and fits with the second inclined portion 552, and slopes of the first inclined portion 551 and the second inclined portion 552 are substantially the same. That is, inclination directions and inclination angles of the first inclined portion 551 and the second inclined portion 552 are substantially the same. When the second end of the adjusting member 52 is operated from the side of the splicing display device by a tool, the adjusting member 52 is driven to move in its extending direction. When the adjusting member 52 is moved such that the first inclined portion 551 comes into contact with the second inclined portion 552, the first inclined portion 551 and the second inclined portion 552 are substantially in surface contact, thereby ensuring fit reliability between the first inclined portion 551 and the second inclined portion 552. As the adjusting member 52 moves, a position at which the first inclined portion 551 and the second inclined portion 552 are in contact changes, but a height of the adjusting member 52 (i.e., a position of the adjusting member 52 in the thickness direction of the display module 20) substantially remains unchanged, and thus the supporting member 53 is driven to move up and down along the limit hole 511. Preferably, the first inclined portion 551 is a tapered surface at the second end of the supporting member 53, the second inclined portion 552 is a tapered surface at the first end of the adjusting member 52, the adjusting member 52 is connected to the mounting seat 51 by a screw; and the adjusting member 52 can be driven to move in the extending direction thereof by rotating, by a tool, the adjusting member 52.

In the specific embodiments shown in FIGS. 25a and 25b, the adjusting member 52 is moved in a left direction in the figures. The position of the adjusting member 52 in the thickness direction of the display module 20 does not substantially change because the adjusting member 52 is provided in a lateral limit hole of the mounting seat 51. Since the supporting member 53 is restricted in the limit hole 511, the first inclined portion 551 of the supporting member 53 contacts and fits with the second inclined portion 552 of the adjusting member 52. As the adjusting member 52 moves in the left direction, the supporting member 53 is gradually pushed up, and the display module 20 is pushed up by the first end of the supporting member 53 to adjust the distance between the part of the display module 20 and the case 10. A process of driving the supporting member 53 to move down by the adjusting member 52 is opposite to the above process, and is not repeatedly described herein.

Figure 27:
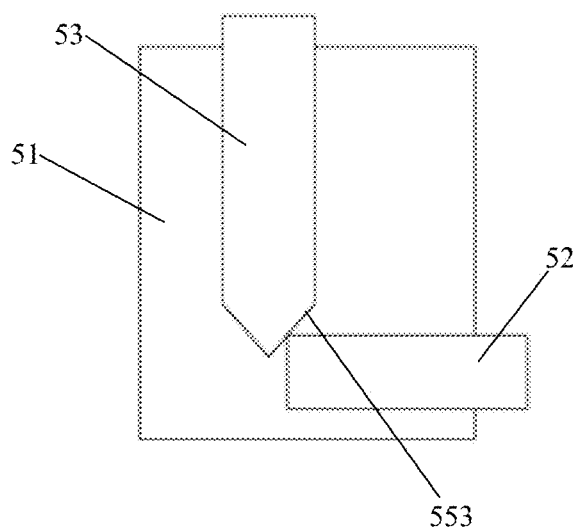
FIG. 27 is a schematic structural diagram of a leveling structure of a splicing display device according to some other embodiments of the present disclosure.
Figure 28:
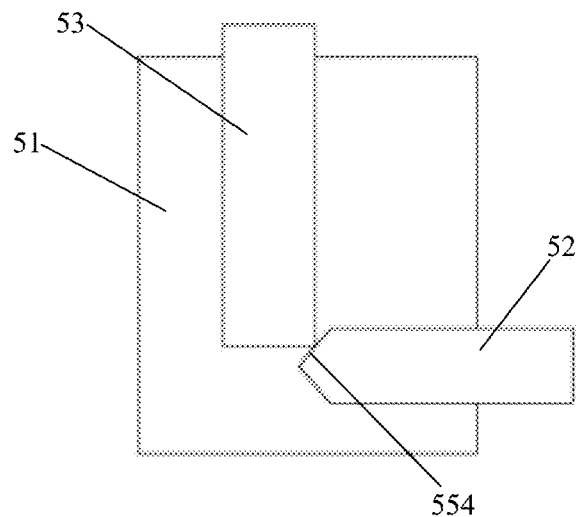
FIG. 28 is a schematic structural diagram of a leveling structure of a splicing display device according to still other embodiments of the present disclosure.

It should be noted that the fit mode between the first end of the adjusting member 52 and the second end of the supporting member 53 is not limited thereto. As shown in FIG. 27, in some embodiments, a third inclined portion 553 is provided at the second end of the supporting member 53, no inclined structure is provided at the first end of the adjusting member 52, and the first end of the adjusting member 52 directly contacts and fits with the third inclined portion 553. In this case, the first end of the adjusting member 52 is in linear contact or point contact with the third inclined portion 553. By the way in which the first end of the adjusting member 52 contacts and fits with the third inclined portion 553, the supporting member 53 can be driven to move up and down by a change in the contact position between the first end of the adjusting member 52 and the third inclined portion 553 during movement of the adjusting member 52. As shown in FIG. 28, in other embodiments, a fourth inclined portion 553 is provided at the first end of the adjusting member 52, no inclined structure is provided at the second end of the supporting member 53, and the second end of the supporting member 53 directly contacts and fits with the fourth inclined portion 554. In this case, the second end of the supporting member 53 is in linear contact or point contact with the fourth inclined portion 554. By the way in which the second end of the supporting member 53 contacts and fits with the fourth inclined portion 554, the supporting member 53 can be driven to move up and down by a change in the contact position between the second end of the supporting member 53 and the fourth inclined portion 554 during movement of the adjusting member 52.

Figure 29:
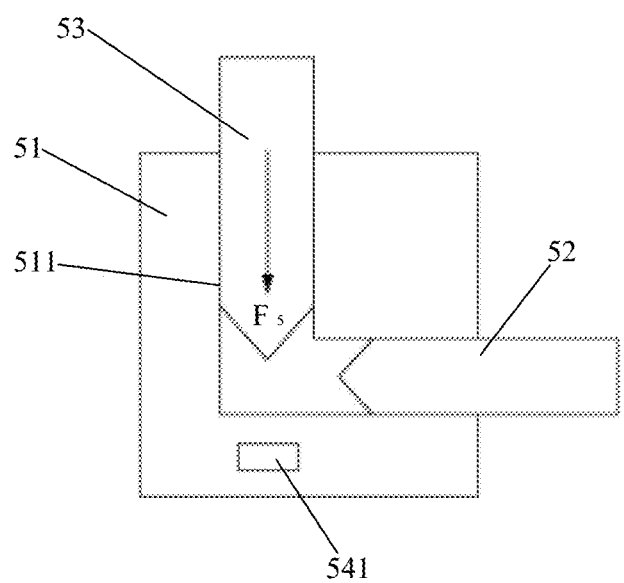
FIG. 29 is a schematic structural diagram of an anti-release member of a leveling structure of a splicing display device according to some embodiments of the present disclosure.
Figure 30:
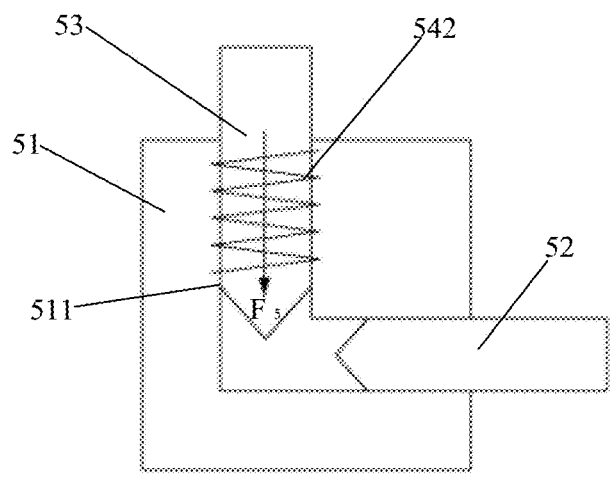
FIG. 30 is a schematic structural diagram of an anti-release member of a leveling structure of a splicing display device according to some other embodiments of the present disclosure.

Further, as shown in FIGS. 29 and 30, in some embodiments, the first leveling assembly further includes an anti-release member disposed on the mounting seat 51 and fitting with the supporting member 53 to continuously apply a third acting force $F_5$ to the supporting member 53, a direction of the third acting force $F_5$ is from the first end of the supporting member 53 to the second end of the supporting member 53, and the supporting member 53 can be prevented by the third acting force $F_5$ from being released from the limit hole 511 in a direction away from the adjusting member 52. The specific structure of the anti-release member is not limited, and may be any structure capable of preventing the supporting member 53 from being released.

For example, in the embodiment shown in FIG. 29, the anti-release member includes a second magnetic adsorption structure 541. The second magnetic adsorption structure 541 is a magnetic component. For example, the second magnetic adsorption structure 541 includes a magnet, the magnet may include a layer including at least one of Fe, Ni, and Cr, or one or more magnetized elements of a magnet, and the magnet can be configured to generate a magnetic field. The supporting member 53 may be a component that can be magnetically adsorbed, for example, the supporting member 53 includes a metal body (for example, iron block, iron sheet) that can be adsorbed by the magnetic field generated by the magnet of the second magnetic adsorption structure 541; alternatively, the supporting member 53 includes a magnet whose magnetic pole is opposite to that of the magnet of the second magnetic adsorption structure 541. The constitution of the magnet included in the supporting member 53 is similar to that of the magnet of the second magnetic adsorption structure 541, and is not repeatedly described herein. The second magnetic attraction structure 541 is located below the supporting member 53, and there is always a magnetic attraction force between the second magnetic attraction structure 541 and the supporting member 53, and the magnetic attraction force forms the third acting force $F_5$. For another example, in the specific embodiment shown in FIG. 30, the anti-release member includes a pre-loaded spring 542 having one end connected to the hole wall of the limit hole 511, and the other end connected to the supporting member 53. The pre-loaded spring 542 can provide a downward pressure or pulling force to the supporting member 53, which forms the third acting force $F_5$.

It should be noted that, in the specific embodiment shown in the figures, the first leveling assembly includes the mounting seat 51 and the adjusting member 52, and the second leveling assembly includes the supporting member 53, that is, the mounting seat 51 is arranged on the case 10. When the supporting member 53 is driven to move up and down, the supporting member 53 fits with the display module 20 to adjust the distance between the display module 20 and the case 10. Of course, it can be understood that in other embodiments not shown in the figures, the first leveling assembly may not include the supporting member 53, the second leveling assembly may include the mounting seat 51 and the adjusting member 52, and in this case, the mounting seat 51 is arranged on the display module 20. When the supporting member 53 is driven to move up and down, the supporting member 53 fits with the case 10 to adjust the distance between the display module 20 and the case 10.

Figure 26:
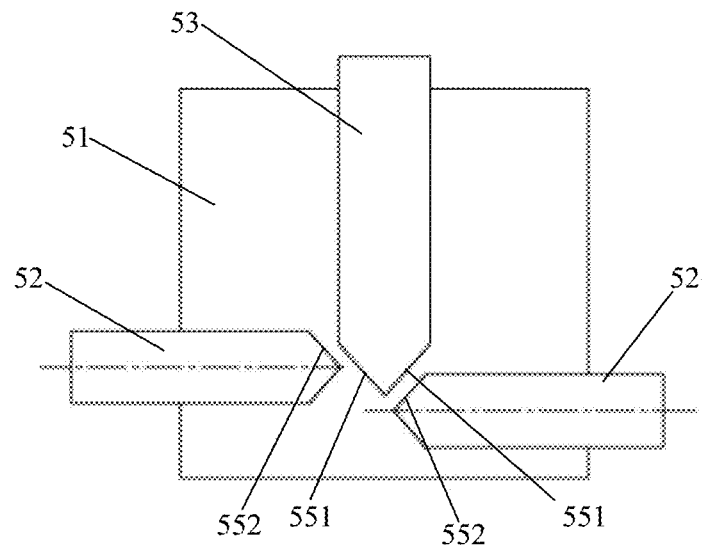
FIG. 26 is a schematic diagram illustrating positional relationship of a plurality of adjusting members of the leveling structure of FIG. 23.

As shown in FIGS. 24 and 26, in some embodiments, in each leveling structure 50, there are a plurality of adjusting members 52, the plurality of adjusting members 52 are arranged along a circumferential direction of the supporting member 53, and the distances of the plurality of adjusting members 52 from the display module 20 are different, that is, the heights of the plurality of adjusting members 52 relative to the case 10 are different. Preferably, the number of the plurality to adjusting members 52 is four, and the four adjusting members 52 are respectively located around the supporting member 53. The forgoing setting of the plurality of adjusting members 52 can allow adjustment operation from different sides of the splicing display device, and the adjustment operation is more flexible. Moreover, since the heights of the plurality of adjusting members 52 relative to the case 10 are different, when one of the adjusting members 52 is adjusted from a side by a tool, the other adjusting members 52 will not become an obstacle or interference, and the adjustment operation is more convenient. In addition, the plurality of leveling structures 50 may be staggered in a plane parallel to a plane where the display module 20 is located, thereby further facilitating improving the convenience of the adjustment operation.

It can be understood that the above embodiments are merely exemplary embodiments adopted to explain the principles of the present disclosure, but the present disclosure is not limited thereto. For those of ordinary skill in the art, various variations and improvements may be made without departing from the spirit and substance of the present disclosure, and these variations and improvements are also considered to fall within the protection scope of the present disclosure.

What is claimed is:

1. A splicing display device, comprising a case, a plurality of display modules on the case, and a mounting structure between the case and at least one display module, the mounting structure comprising:
   a first positioning assembly on a side of the case facing the display module; and
   a second positioning assembly on a side of the display module facing the case,
   wherein positions of the first positioning assembly and the second positioning assembly correspond to each other in a thickness direction of the display module, and the first positioning assembly and the second positioning assembly contact and fit in a direction parallel to a plane in which the display module is located, so as to cause the display module to fit with and be in contact with at least one display module adjacent thereto; and
   the first positioning assembly comprises a positioning pillar, the positioning pillar comprising a first sidewall and a second sidewall opposite to each other;
   the second positioning assembly comprises a positioning fitting member and a pressing member, the positioning fitting member has a positioning hole along the thickness direction of the display module, the pressing member is on the positioning fitting member and at least partially in the positioning hole,
   a part of the pressing member in the positioning hole contacts and fits with the first sidewall after the positioning pillar is inserted into the positioning hole, so that the second sidewall fits with and is in contact with a hole wall of the positioning hole.

2. The splicing display device according to claim 1, wherein the pressing member is a compression spring, the compression spring comprises a pressing section, the positioning hole comprises a first hole wall and a second hole wall opposite to each other, the pressing section is between the first hole wall and the second hole wall, and the pressing section is gradually switched from an initial state to a first pressing state by the contact and fit between the positioning pillar and the pressing section during a process of inserting the positioning pillar into the positioning hole, wherein
   in a case where the pressing section is in the first pressing state, the pressing section contacts and fits with the first sidewall, and the second sidewall fits with and is in contact with the second hole wall; and a maximum distance between the pressing section and the first hole wall in the case where the pressing section is in the first pressing state is less than a maximum distance between the pressing section and the first hole wall in a case where the pressing section is in the initial state.

3. The splicing display device according to claim 2, wherein the mounting structure further comprises:

a first limiter on a side of the pressing section facing the second hole wall; and
a second limiter on the first sidewall of the positioning pillar,
wherein when the pressing section is in the first pressing state, positions of the first limiter and the second limiter correspond to each other in the direction parallel to the plane in which the display module is located, and the first limiter and the second limiter fit with each other, so as to limit positions of the pressing section and the positioning pillar in the thickness direction of the display module.

4. The splicing display device according to claim 3, wherein the first limiter comprises a limit protrusion, and the second limiter comprises a limit recess, and in the case where the pressing section is in the first pressing state, the limit protrusion is clamped into the limit recess to connect the pressing section and the positioning pillar by clamping.

5. The splicing display device according to claim 4, wherein sizes and shapes of the limit protrusion and the limit recess match with each other, and a surface of the limit protrusion is arcuate at least in a movement direction in which the positioning pillar is inserted into the positioning hole.

6. The splicing display device according to claim 2, wherein in the case where the pressing section is in the first pressing state, there is a movable distance between the pressing section and the first hole wall, the positioning pillar is able to be driven to move in a direction close to the first hole wall by controlling a corresponding display module to move laterally in a direction facing away from the at least one display module adjacent thereto, and the pressing section is switched from the first pressing state to a second pressing state through the contact and fit between the positioning pillar and the pressing section, wherein a maximum distance between the pressing section and the first hole wall in a case where the pressing section is in the second pressing state is less than the maximum distance between the pressing section and the first hole wall in the case where the pressing section is in the first pressing state.

7. The splicing display device according to claim 2, wherein a first end of the pressing section is at an entry of the positioning hole, a second end of the pressing section extends in a direction away from the entry and is a free end, and in the case where the pressing section is in the initial state, a distance of the pressing section from the first hole wall gradually increases along a direction from the first end to the second end thereof.

8. The splicing display device according to claim 7, wherein the positioning fitting member further has a fixing recess spaced apart from the positioning hole, the compression spring further comprises a fixing section and an intermediate section, the intermediate section is connected between the fixing section and the pressing section, the fixing section is inserted into and connected to the fixing recess, and the intermediate section is on a side of the positioning fitting member facing the positioning pillar.

9. The splicing display device according to claim 8, wherein an end of the fixing section away from the intermediate section is provided with a hook, and the hook is embedded in a sidewall of the fixing recess.

10. The splicing display device according to claim 2, wherein the positioning pillar comprises a main body and a guide end, the guide end is on a side of the main body facing the positioning fitting member, and a cross-sectional area of the guide end gradually decreases along the movement direction in which the positioning pillar is inserted into the positioning hole.

11. The splicing display device according to claim 1, wherein for the at least one display module, a plurality of mounting structures are arranged between each display module and the case, the plurality of mounting structures are arranged along a circumferential direction of the display module, and each mounting structure is arranged close to an edge of the display module.

12. The splicing display device according to claim 1, wherein a first connector is provided on the display module, a second connector is provided on the case, positions of the first connector and the second connector correspond to each other in the thickness direction of the display module, and the first connector and the second connector are connected by magnetic adsorption.

13. The splicing display device according to claim 1, wherein in two adjacent display modules, a third connector and a fourth connector are respectively arranged on opposite sides of the two display modules, positions of the third connector and the fourth connector correspond to each other in a splicing direction in which the two display modules are spliced, and the third connector and the fourth connector are connected by magnetic adsorption.

14. The splicing display device according to claim 13, wherein each display module comprises a first side, a second side, a third side and a fourth side which are sequentially connected, each of the first side and the second side is provided with at least one third connector, each of the third side and the fourth side is provided with at least one fourth connector, a number of the at least one third connector on the first side and a number of the at least one fourth connector on the third side are the same, a position of the at least one third connector on the first side and a position of the at least one fourth connector on the third side are in one-to-one correspondence, a number of the at least one third connector on the second side and a number of the at least one fourth connector on the fourth side are the same and a position of the at least one third connector on the second side and a position of the at least one fourth connector on the fourth side are in one-to-one correspondence.

15. A splicing display device, comprising a case, a plurality of display modules on the case, and a mounting structure between the case and at least one display module, the mounting structure comprising:
a first positioning assembly on a side of the case facing the display module; and
a second positioning assembly on a side of the display module facing the case,
wherein positions of the first positioning assembly and the second positioning assembly correspond to each other in a thickness direction of the display module, and the first positioning assembly and the second positioning assembly contact and fit in a direction parallel to a plane in which the display module is located, so as to cause the display module to fit with and be in contact with at least one display module adjacent thereto;
the splicing display device further comprises leveling structures, wherein each display module is provided with corresponding ones of the leveling structures arranged between the display module and the case, and the ones of the leveling structures are arranged along a circumferential direction of the display module, each leveling structure comprises:
a first leveling assembly fitting with a side of the case facing the display module; and a second leveling assembly fitting with a side of the display module facing the case, wherein positions of the first leveling assembly and the second leveling assembly correspond to each other in the thickness direction of the display module, the first leveling assembly and the second leveling fit by driving, and by operating the leveling structure from a side of the splicing display device, a distance between a part of the display module corresponding to the leveling structure and the case is able to be changed;

the first leveling assembly comprises a mounting seat and an adjusting member, the mounting seat is on a side of the case facing the display module, the mounting seat has a limit hole along the thickness direction of the display module, a first end of the adjusting member is inserted into the limit hole from a side of the mounting seat, and a second end of the adjusting member is outside the mounting seat;

the second leveling assembly comprises a supporting member in the limit hole and capable of moving up and down along the limit hole, a first end of the supporting member is configured to fit with a side of the display module facing the case, and a first end of the adjusting member is configured to fit with a second end of the supporting member, and when the second end of the adjusting member is operated from a side of the splicing display device, the adjusting member is able to be driven to move in an extending direction thereof, and the supporting member is driven to move up and down through the fit between the first end of the adjusting member and the second end of the supporting member.

16. The splicing display device according to claim 15, wherein the second end of the supporting member is provided with a first inclined portion, the first end of the adjusting member is provided with a second inclined portion, the first inclined portion contacts and fits with the second inclined portion, and a slope of the first inclined portion is the same as a slope of the second inclined portion; or the second end of the supporting member is provided with a third inclined portion, and the first end of the adjusting member contacts and fits with the third inclined portion; or, the first end of the adjusting member is provided with a fourth inclined portion, and the second end of the supporting member contacts and fits with the fourth inclined portion.

17. The splicing display device according to claim 15, wherein the first leveling assembly further comprises an anti-release member, the anti-release member is on the mounting seat and fits with the supporting member to prevent the supporting member from being released from the limit hole in a direction away from the adjusting member.

18. The splicing display device according to claim 15, wherein in each leveling structure, there are a plurality of adjusting members, the plurality of adjusting members are arranged along a circumferential direction of the supporting member, and distances of the plurality of adjusting members from the display module are different to each other.

* * * * *